United States Patent [19]
Iwamura et al.

[11] Patent Number: 5,362,998
[45] Date of Patent: Nov. 8, 1994

[54] COMPOSITE CIRCUIT OF BIPOLAR TRANSISTORS AND MOS TRANSISTORS AND SEMICONDUCTOR INTEGRATED CIRCUIT DEVICE USING THE SAME

[75] Inventors: Masahiro Iwamura; Hideo Maejima, both of Hitachi; Atsuo Watanabe, Hitachiota; Kazutaka Mori, Higashiyamato, all of Japan

[73] Assignee: Hitachi Ltd., Tokyo, Japan

[21] Appl. No.: 193,643

[22] Filed: Feb. 7, 1994

Related U.S. Application Data

[63] Continuation of Ser. No. 762,335, Sep. 19, 1991, abandoned.

[30] Foreign Application Priority Data

Sep. 19, 1990 [JP] Japan ................... 2-247544

[51] Int. Cl.$^5$ .............................................. H03K 19/02
[52] U.S. Cl. ..................................... 326/110; 327/433; 327/379; 327/387; 327/208
[58] Field of Search ............... 307/446, 570, 572, 573, 307/288, 500

[56] References Cited

U.S. PATENT DOCUMENTS 4,682,054 7/1987 McLaughlin ...................... 307/570

FOREIGN PATENT DOCUMENTS 54148469 5/1978 Japan .
59-11034 1/1984 Japan .
60-141018 7/1985 Japan .

OTHER PUBLICATIONS

IEEE 1989 Bipolar Circuits and Technology Meeting Sep. 1989 pp. 229–232.
1990 Symposium or VLSI Circuits pp. 89–90 Jun. 1990.

*Primary Examiner*—Robert J. Pascal
*Assistant Examiner*—Reginald A. Ratliff
*Attorney, Agent, or Firm*—Antonelli, Terry, Stout & Kraus

[57] ABSTRACT

A composite circuit device of bipolar transistors and MOS transistors has a series connection of an NPN transistor for pull-up and a PNP transistor for pull-down. The composite circuit device has independent base drive circuits so provided that the base of the NPN transistor for pull-up is electrically isolated from the base of the PNP transistor for pull-down during the on-off switching operation. The composite circuit device is also provided with base precharge circuitry for pre-charging the base of the PNP transistor during the off operation state thereof. A composite circuit is also provided with circuitry for enhancing the turn-on switching speed of the pull-down PNP transistor. Additionally, a composite circuit of bipolar transistors and MOS transistors is constituted by a switch having a high input impedance and low on-resistance which can be applied as a component of an electronic circuit.

42 Claims, 13 Drawing Sheets

COMPOSITE CIRCUIT OF BIPOLAR TRANSISTORS AND MOS TRANSISTORS AND SEMICONDUCTOR INTEGRATED CIRCUIT DEVICE USING THE SAME

This application is a continuation of application Ser. No. 07/762,335, now abandoned, filed Sep. 19, 1991.

BACKGROUND OF THE INVENTION

The present invention relates to a composite circuit using bipolar transistors and MOS transistors and it also pertains to a semiconductor integrated circuit device and system using the composite circuit.

A totem pole output type bipolar complementary metal oxide semiconductor (BiCMOS) logic circuit comprised of MOS transistors and bipolar transistors and having an output stage constructed of two NPN transistors is known from JP-A-59-11034 and other published documents. The totem pole output type circuit can provide sufficiently high-speed operation at a power supply voltage of approximately 5V but, however, loses the advantage of the high-speed operation capability when the power supply voltage is reduced to about 3V (which is considered to be a new generation standard power supply voltage) or less. This mainly results from the fact that the gate-source voltage of an N-channel MOS (NMOS) transistor adapted to supply base current to an NPN transistor for pull-down used in the totem-pole output circuit decreases as the power supply voltage decreases, failing to supply a sufficient base current to the NPN transistor for pull-down.

Under the circumstances, a BiNMOS type circuit using an NPN transistor adapted for pull-up and an NMOS transistor adapted for pull-down and a complementary emitter follower type circuit using an NPN transistor adapted for pull-up and a PNP transistor adapted for pull-down have been considered to be promising BiCMOS circuits meeting the coming low power supply voltage generation. In high or heavy load regions, the BiNMOS type circuit decreases in driving capability and is, therefore, unsuitable but the complementary emitter follower type is suitable. Examples of the complementary emitter follower type BiCMOS circuit are described in JP-A-54-148469, JP-A-60-141018, U.S. Pat. No. 4,682,054 and IEEE 1989 Bipolar Circuits and Technology Meeting September 1989, pp. 229–232. Another literature of 1990 Symposium on VLSI Circuits pp 89–90, June, 1990 also describes a BiCMOS circuit of complementary emitter follower type.

The prior art complementary emitter follower type BiCMOS circuit as above faces, however, a problem that the bipolar transistor has a delayed response to a change in the input signal.

Further, the PNP transistor for pull-down has a value of cut-off frequency $f_T$ which is lower than that of the NPN transistor, thereby raising a problem that the upper limit of the circuit performance is restricted by the performance of the PNP transistor.

SUMMARY OF THE INVENTION

An object of the invention is to provide a complementary emitter follower type BiCMOS logic circuit which can enhance the response performance of the bipolar transistor to a change in the input signal.

Another object of the invention is to provide a complementary emitter follower type BiCMOS logic circuit with a performance capability that is not restricted by the performance capability of by the PNP transistor.

Still another object of the invention is to provide a circuit of PNP and MOS transitors used in combination which is useful to construct a variety of switching circuits.

Still another object of the invention is to provide a semiconductor integrated circuit device and system using a composite circuit of PNP and MOS transistors used in combination.

To accomplish the above object, in accordance with one aspect of the present invention the base of an NPN transistor for pull-up and the base of a PNP transistor for pull-down are respectively driven by means of independent base drive circuits so that these bases may be isolated electrically from each other, and the base of the PNP transistor is pre-charged by base pre-charge means.

In accordance with another aspect of the present invention, an NMOS logic circuit controllable by an input signal is provided between the emitter and collector of a PNP transistor for pull-down in a complementary emitter follower BiCMOS logic circuit.

Since the base of the NPN transistor for pull-up is electrically isolated from the base of the PNP transistor for pull-down, charge/discharge of the respective base nodes can be completed sufficiently by charging/discharging only parasitic capacitances associated with these bases. The NMOS logic circuit provided between the emitter and collector of the PNP transistor for pull-down exhibits a greater high-speed response to a change in the input signal than the PNP transistor, thereby increasing the operation speed of pull-down and the load driving capability.

BRIEF DESCRIPTION OF THE DRAWINGS

These and other objects, features and advantages of the present invention will be understood more clearly from the following detailed description with reference to the accompanying drawings, wherein.

DESCRIPTION OF THE PREFERRED EMBODIMENTS

Figure 1:
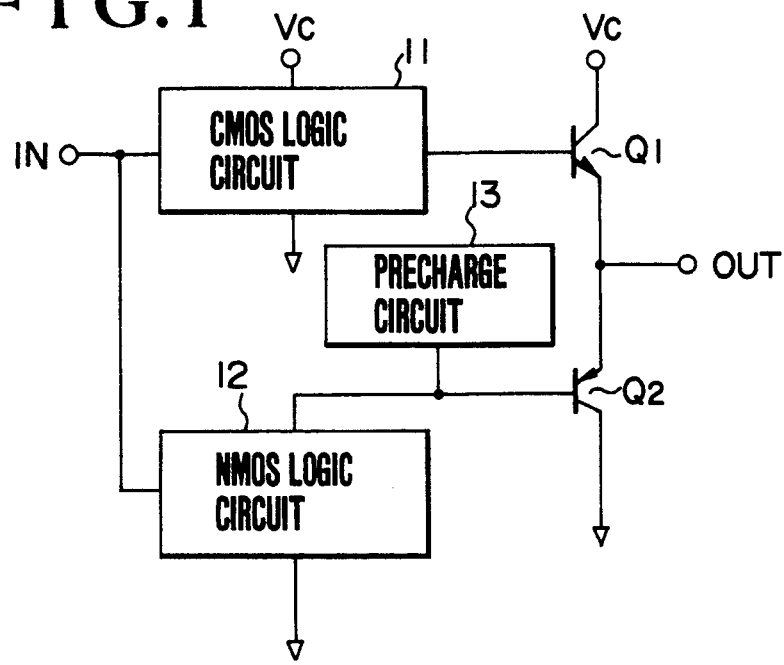
FIG. 1 is a circuit diagram showing a first embodiment of the invention.

FIG. 1 shows a first embodiment of the present invention. In the following description, the same parts will be designated by the same reference numerals or characters throughout the drawings.

Referring to FIG. 1, an NPN transistor Q1 has a collector connected to a power supply Vc and an emitter connected to an output terminal OUT, a PNP transistor Q2 has an emitter connected to the output terminal OUT and a collector connected to a reference potential Vs such as the ground potential, and a CMOS logic circuit 11 is connected to respond to an input signal IN to drive a base of the NPN transistor Q1 to a logic "1" or "0" level. An NMOS logical circuit 12 connected between a base of PNP transistor Q2 and, the reference potential, responds to the input signal IN to on/off control a base current of the PNP transistor Q2. While the PNP transistor Q2 remains turned off, a base pre-charge circuit 13 sets the base potential of the PNP transistor Q2 to a predetermined level which is substantially equal to or lower than its emitter potential.

The operation of the present embodiment will now be described. Assuming now that the input signal IN initially switches from "1" level to "0" level, the NMOS logic circuit 12 is turned off to turn off the PNP transistor Q2. On the other hand, the output of the CMOS logical circuit 11 switches from "0" level to "1" level to turn on the NPN transistor Q1. As a result, the output terminal OUT switches to "1" level. At that time, the base pre-charge circuit 13 pre-charges the base mode of the PNP transistor Q2 to the predetermined level. It is important that the predetermined level be of a magnitude which is necessary to cut off the PNP transistor Q2 but prevents an excessive cut-off state thereof.

Subsequently, the input signal IN switches from "0" level to "1" level. At that time, the output of the CMOS logic circuit 11 switches to "0" level, thus turning off the NPN transistor Q1. On the other hand, the NMOS logic circuit 12 is turned on and consequently a base current flows through the PNP transistor Q2 to turn the same on. As a result, the output terminal OUT switches to "0" level.

It will be here appreciated that one of the features of the present invention resides in that the NPN transistor Q1 for pull-up and the PNP transitor Q2 for pull-down are driven independently by means of the CMOS logical cricuit 11 and NMOS logical circuit 12, respectively, to ensure electrical isolation between the bases of the NPN transistor Q1 and PNP transistor Q2. By virtue of this feature, the CMOS logic circuit 11 is required to charge only a parasitic capacitance associated with the base of the NPN transistor Q1 when the output terminal OUT is switched to "1" level and therefore the NPN transistor Q1 is allowed to be turned on at a high speed. Similarly, when the output terminal OUT is switched to "0" level, the NMOS logic circuit 12 is required to discharge only the parasitic capacitance associated with the base of the PNP transistor Q2, thus allowing the PNP transistor Q2 to be turned on at a high speed. Typically, the parasitic capacitance associated with the base of the NPN transistor Q1 includes junction capacitances of the NPN transistor Q1 and CMOS logic circuit 11, and the parasitic capacitance associated with the base of the PNP transistor Q2 includes junction capacitances of the PNP transistor Q2 and NMOS logical circuit 12.

Further, the base pre-charge circuit 13 sets the predetermined level of base potential of transistor Q2 which does not make the base potential excessively high while the transistor Q2 remains turned off. Accordingly, when the PNP transistor Q2 is turned on by turning on the NMOS logic circuit 12, the time consumed to switch the base potential of the PNP transistor Q2 to "0" level can be decreased to ensure that the PNP transistor Q2 can be turned on at higher speed.

In the embodiment of FIG. 1, only one input signal IN is applied, but the present invention is not limited thereto and may be realized in general by using N inputs. For N inputs, the CMOS logic circuit 11 and NMOS logic circuit 12 will be modified respectively to take the form of an N-input logic circuit. For simplicity of explanation and better understanding of the invention, embodiments to be described hereinafter will all be described as having one input.

Figure 2:
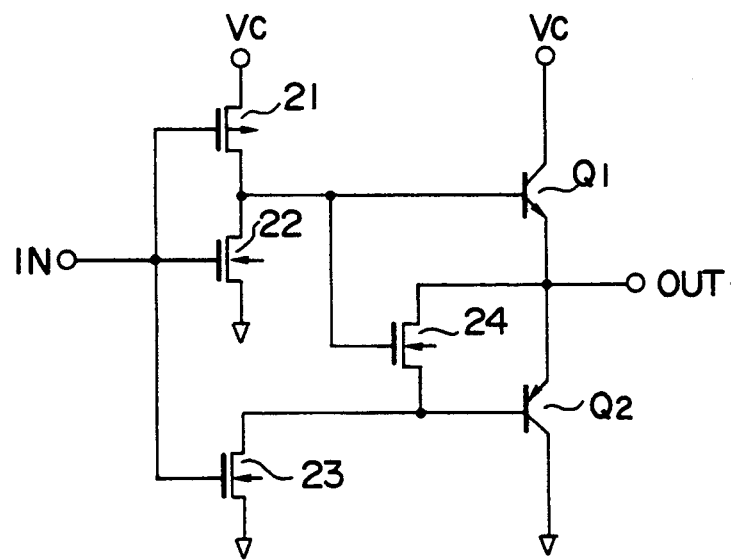
FIG. 2 is a circuit diagram showing a second embodiment of the invention.

FIG. 2 shows a second embodiment of the invention. Referring to FIG. 2, an NPN transistor Q1 has a collector connected to a power supply Vc and an emitter connected to an output terminal OUT; a PNP transistor Q2 has an emitter connected to the output terminal OUT and a collector connected to a reference potential; a PMOS transistor 21 has a source connected to the power supply Vc, a gate connected to an input terminal IN and a drain connected to a base of the NPN transistor Q1; an NMOS transistor 22 has a drain connected to the base of the NPN transistor Q1, a gate connected to the input terminal IN and a source connected to the reference potential; an NMOS transistor 23 has a drain connected to a base of the PNP transistor Q2, a gate connected to the input terminal IN and a source connected to the reference potential; and an NMOS transistor 24 has a drain connected to the output terminal OUT, a gate connected to the base of the NPN transistor Q1 and a source connected to the base of the PNP transistor Q2.

Here, the PMOS transistor 21 and NMOS transistor 22 correspond to the CMOS logic circuit 11 of FIG. 1 and the NMOS transistor 23 corresponds to the NMOS logic circuit 12. The NMOS transistor 24 corresponds to the base pre-charge circuit 13 of FIG. 1.

The operation of the FIG. 2 circuit is as follows. Initially, it is assumed that the input terminal IN switches from "1" level to "0" level. At that time, the NMOS transistors 22 and 23 are turned off and the PNP transistor Q2 is also turned off in the absence of base current flowing through this transistor. On the other hand, the PMOS transistor 21 is turned on and the NPN transistor Q1 is also turned on, switching the output terminal OUT to "1" level. At that time, the NMOS trasnsitor 24 is also turned on, with the result that charging current from the output terminal OUT flows into the base of the PNP transistor Q2 through the NMOS transistor 24 so as to pre-charge base potential of the PNP transistor Q2 to a level which is lower by Vth than gate voltage of the NMOS transistor 24, where Vth is a threshold of MOS transistors. Accordingly, the base potential of the PNP transistor Q2 is pre-charged to a predetermined level which is lower than voltage Vc by Vth.

Subsequently, when the input terminal IN switches from "0" level to "1" level, the PMOS transistor 21 and NPN transistor Q1 are turned off and the NMOS transistors 22 and 23 are turned on. As a result, the NMOS transistor 24 is turned off and the PNP transistor Q2 is turned on, switching the output terminal OUT to "0" level.

Advantageously, since in the FIG. 2 circuit the NPN transistor Q1 and PNP transistor Q2 are driven independently of each other and so their bases are electrically isolated from each other, charging or discharging of surplus parasitic capacitance becomes unnecessary; therefore, pull-up and pull-down of the output terminal OUT can both be done at higher speeds than in the prior art circuit.

Further, while the PNP transistor Q2 remains turned off, its base potential is pre-charged to the level which is lower than the potential of power supply Vc by a threshold voltage Vth of the transistor 24 and therefore, the time necessary for parasitic capacitance associated with the base of the transistor Q2 to discharge upon subsequent turn-on of the transistor Q2 can be decreased, thereby attaining a further advantage of a high-speed response.

Figure 3:
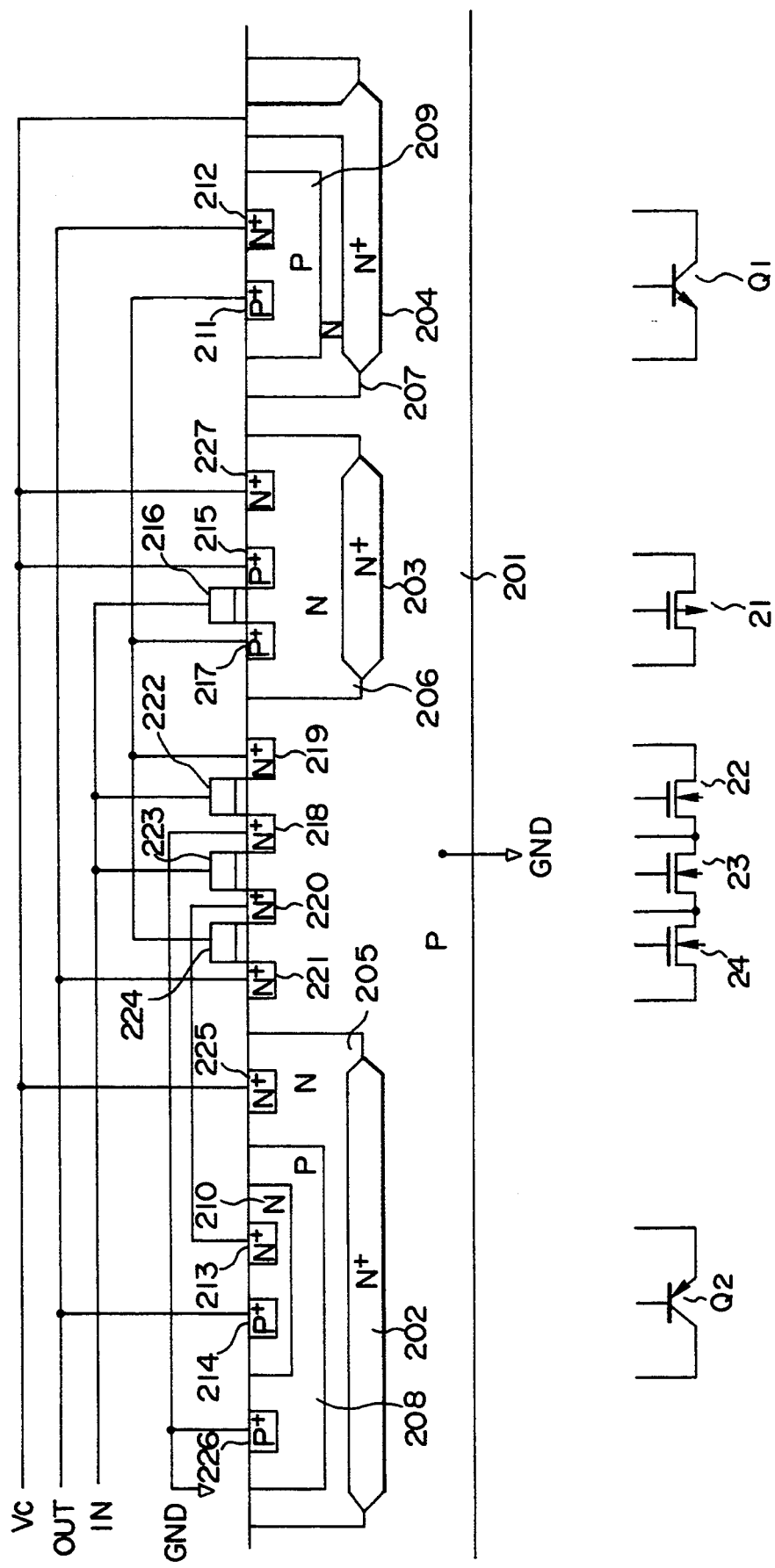
FIG. 3 is a cross-section showing a device structure of the FIG. 2 embodiment.

FIG. 3 shows an example of a cross-section of a device incorporating the FIG. 2 circuit. Referring to FIG. 3, a P-type semiconductor substrate 201 has a substrate potential fixed to ground (GND) potential. The NPN transistor Q1 has its collector in the form of an N-type semiconductor layer 207, its base in the form of a P-type semiconductor layer 209 and its emitter in the form of an N+-type semiconductor layer 212, with collector and base electrodes led from N+-type semiconductor layer 204 and P+-type semiconductor layer 211, respectively.

The PNP transistor Q2 has its collector in the form of a P-type semiconductor layer 208, its base in the form of an N-type semiconductor layer 210 and its emitter in the form of an P+-type semiconductor layer 214, with a base electrode led from an N+-type semiconductor layer 213. An N-type semiconductor layer 205 with an N+-type buried layer 202 is connected to the power supply Vc through an N+-type semiconductor layer 225.

The PMOS transistor 21 has its substrate in the form of an N-type semiconductor layer (well region) 206 with an N+-type buried layer 203, its source in the form of a P+-type semiconductor layer 215 and its drain in the form of a P+-type semiconductor layer 217, with a gate electrode 216 made of, for example, polysilicon. The N-type substrate 206 is connected to the power supply Vc through an N+-type semiconductor layer 227.

The NMOS transistors 22, 23 and 24 have the P-type semiconductor layer 201 as a common substrate. An N+-type semiconductor layer 219 is formed as the drain of the NMOS transistor 22, an N+-type semiconductor layer 218 is formed as a common source of the NMOS transistors 22 and 23, and N+-type semiconductor layer 220 is a common layer which acts as the drain of the NMOS transistor 23 and the source of the NMOS transistor 24, and an N+-type diffused layer 221 is formed as the drain of the NMOS transistor 24. The NMOS transistors 22, 23 and 24 have their gates 222, 223 and 224 which are made of, for example, polysilicon.

Importantly, the P-type semiconductor layer 208 forming the collector of the PNP transistor Q2 is separated from the semiconductor substrate in the form of the P-type semiconductor layer 201 by the N-type semiconductor layer 205, thus ensuring that even when a large discharge current flows through the collector of the PNP transistor Q2, the potential at the semiconductor substrate 201 will not be caused to vary. Accordingly, any unwanted interference with other transistors on the same chip and latch-up will not occur.

Figure 4:
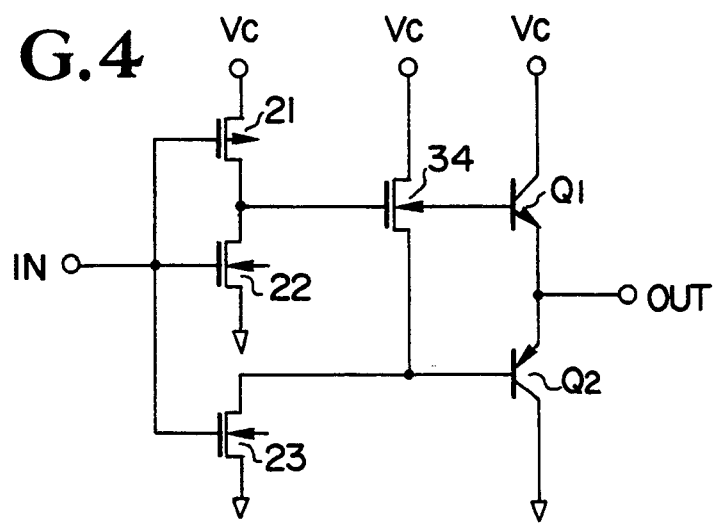
FIG. 4 is a circuit diagram showing a third embodiment of the invention.

FIG. 4 shows a third embodiment of the invention. Referring to FIG. 4, an NMOS transistor 34 has a drain connected to a power supply Vc, a gate connected to a base of an NPN transistor Q1 and a source connected to a base of a PNP transistor Q2, and the remaining circuit elements are the same as those of the FIG. 2 embodiment. Logical circuits of the FIG. 4 embodiment have the same function and feature as the logic circuits of the FIG. 2 embodiment. With the PNP transistor Q2 turned off, the NMOS transistor 34 is turned on and at that time, the power supply Vc pre-charges the base of the PNP transistor Q2 through the NMOS transistor 34 to a potential level which is lower than gate voltage of the NMOS transistor 34 by its threshold voltage Vth.

Figure 5:
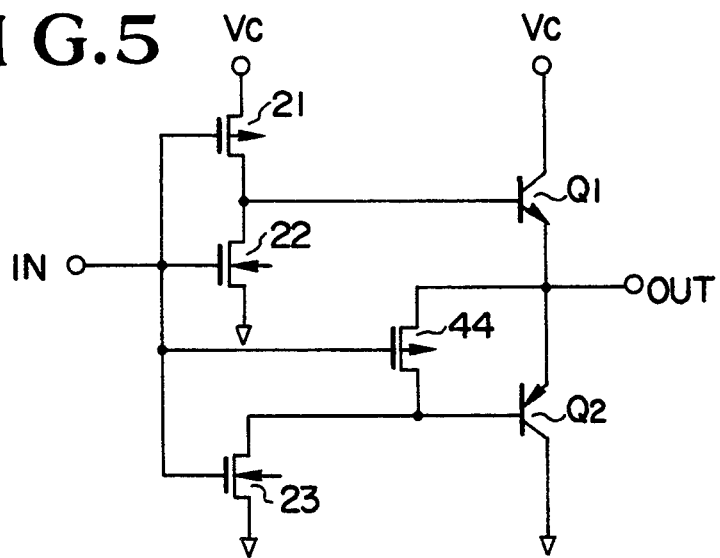
FIG. 5 is a circuit diagram showing a fourth embodiment of the invention.

FIG. 5 shows a fourth embodiment of the invention. Referring to FIG. 5, a PMOS transistor 44 has a drain connected to a base of a PNP transistor Q2, a gate connected to an input terminal IN and a source connected to an output terminal OUT, and the remaining circuit elements are the same as those of the FIG. 2 embodiment. Logical circuits of the FIG. 5 embodiment have the same function and feature as the logical circuits of the FIG. 2 embodiment. With the PNP transistor Q2 turned off, the PMOS transistor 44 is turned on and at that time, the base potential of the PNP transistor Q2 is charged from the output terminal OUT through the PMOS transistor 44 to the same level as that at the output terminal OUT.

Figure 6:
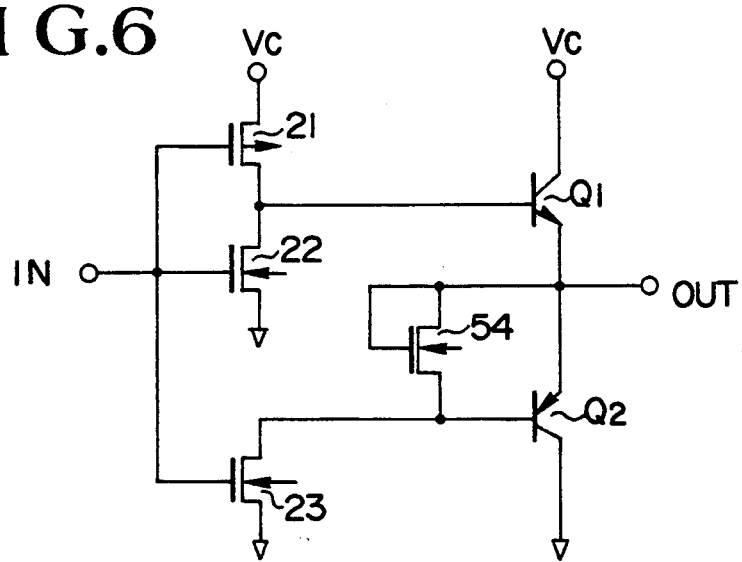
FIG. 6 is a circuit diagram showing a fifth embodiment of the invention.

FIG. 6 shows a fifth embodiment of the invention. In the figure, an NMOS transistor 54 has a drain and a gate connected in common to an output terminal OUT and a source connected to the base of a PNP transistor Q2, and the remaining circuit elements and the function and feature of logical circuits are the same as those in the FIG. 2 embodiment.

With the PNP transistor Q2 turned off, the NMOS transistor 54 permits charging current to flow from the output terminal OUT to the base of the PNP transistor Q2, thereby pre-charging the base potential to a level which is lower than potential at the output terminal OUT by Vth.

Figure 7:
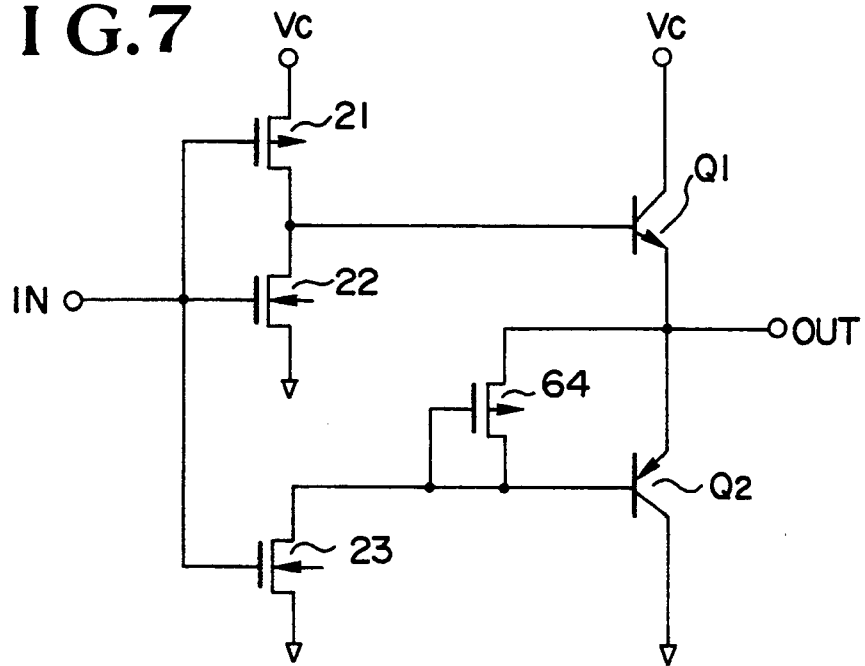
FIG. 7 is a circuit diagram showing a sixth embodiment of the invention.

FIG. 7 shows a sixth embodiment of the invention. In the figure, a PMOS transistor 64 has a source connected to an output terminal OUT and a gate and a drain connected in common to a base of a PNP transistor Q2, and the remaining circuit elements and the function and feature of logical circuits are the same as those in the FIG. 2 embodiment. With the PNP transistor Q2 turned off, the PMOS transistor 64 permits charging current to flow from the output terminal OUT to the base of the PNP transistor Q2, so that the base potential is increased by pre-charge to a level which is lower than the potential at the output terminal OUT by Vth.

Figure 8:
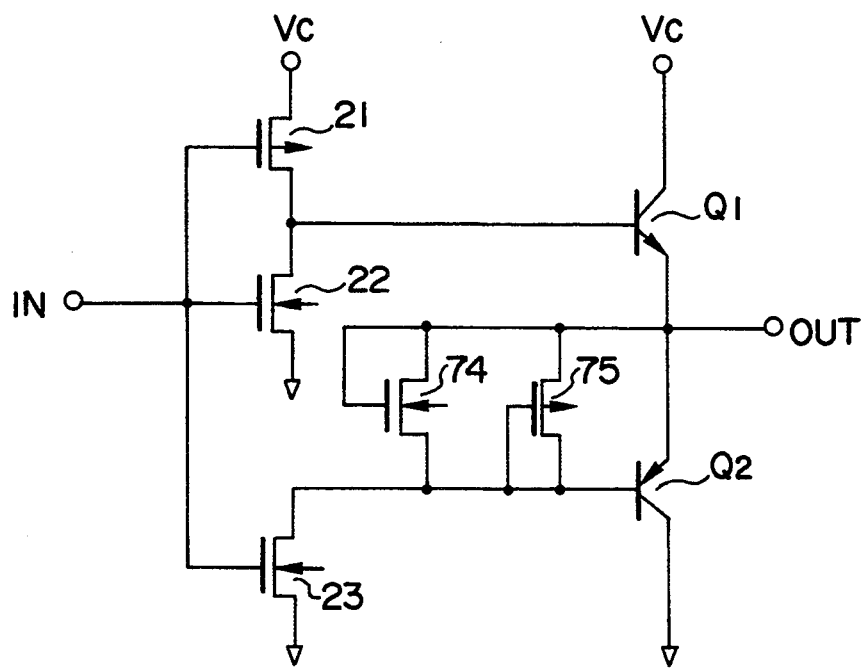
FIG. 8 is a circuit diagram showing a seventh embodiment of the invention.

FIG. 8 shows a seventh embodiment of the invention. In FIG. 8, an NMOS transistor 74 has a drain and a gate connected in common to an output terminal OUT and a source connected to the base of a PNP transistor Q2, a PMOS transistor 75 has a source connected to the output terminal OUT and a gate and a drain connected in common to the base of the PNP transistor Q2, and the remaining circuit elements and the function and feature of logical circuits are the same as those in the FIG. 2 embodiment. With the PNP transistor Q2 turned off, the NMOS transistor 74 and PMOS transistor 75 permit charging current to flow from the output terminal OUT to the base of PNP transistor Q2, so that the base potential is elevated by pre-charge to a level which is lower than potential at the output terminal OUT by Vth.

Figure 9:
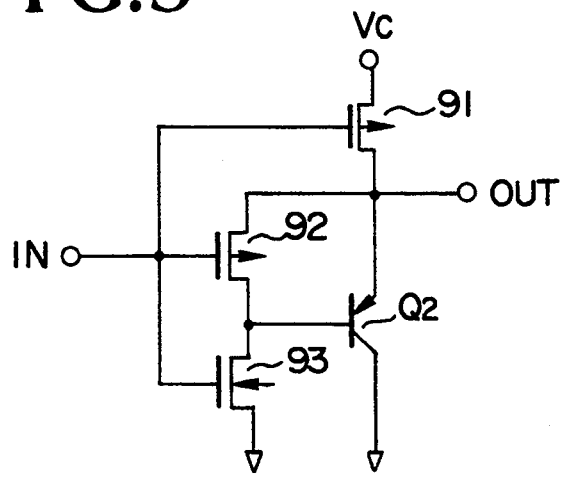
FIG. 9 is a circuit diagram showing an eighth embodiment of the invention.

FIG. 9 shows an eighth embodiment of the invention. In FIG. 9, a PMOS transistor 91 has a source connected to a power supply Vc, a gate connected to an input terminal IN and a drain connected to an output terminal OUT; a PMOS transistor 92 has a source connected to the output terminal OUT, a gate connected to the input terminal IN and a drain connected to the base of a PNP transistor Q2; and an NMOS transistor 93 has a drain connected to the base of a PNP transistor Q2, a gate connected to the input terminal IN and a source connected to a reference potential Vs. The PNP transistor Q2 has a collector connected to the reference potential Vs and an emitter connected to the output terminal.

The operation of the FIG. 9 circuit is as follows. Initially, it is assumed that the input terminal IN switches from a logical "1" level to "0" level. At that time, the NMOS transistor 93 is turned off and the PNP transistor Q2 is also turned off. On the other hand, the PMOS transistor 91 is turned on, switching the output terminal OUT to "1" level. Concurrently therewith, the PMOS transistor 92 is also turned on to permit charging current to flow from the output terminal OUT to the base of the PNP transistor Q2, thereby elevating through pre-charging the base potential to the same level as that at the output terminal OUT.

Subsequently, when the input terminal IN switches from a logical "0" level to "1" level, the PMOS transistors 91 and 92 are turned off and the NMOS transistor 93 is turned on. As a result, the PNP transistor Q2 is turned on, switching the output terminal OUT to "0" level. Since in the present embodiment, the base potential of the PNP transistor Q2 can be raised through changing only to the same level as its emitter potential at the most, the time for the base node to discharge when the next turn-on occurs can be decreased and pull-down of output at the output terminal OUT can be achieved at a high speed.

Figure 10:
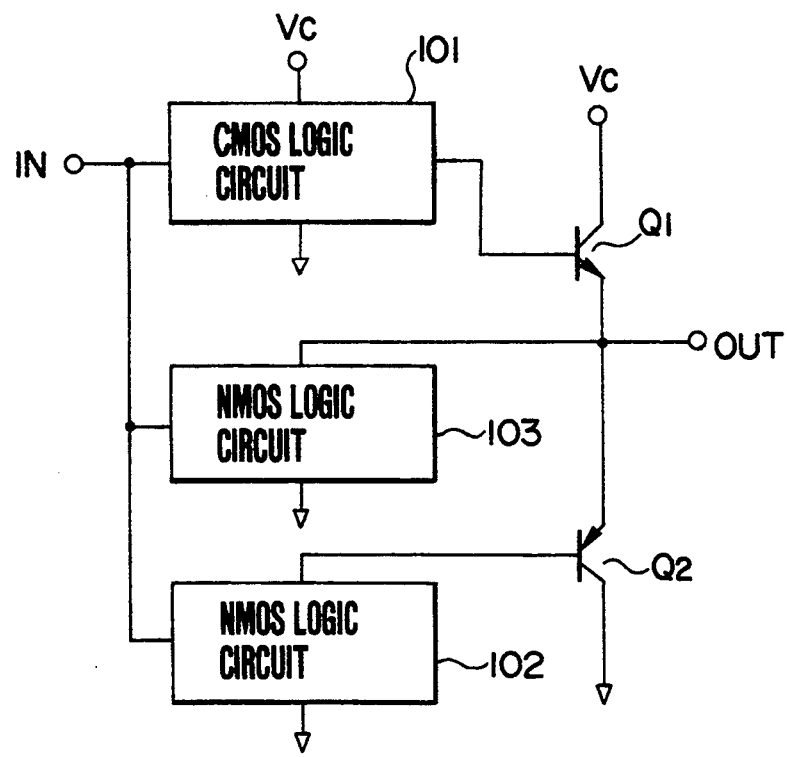
FIG. 10 is a circuit diagram showing a ninth embodiment of the invention.

FIG. 10 shows a ninth embodiment of the invention. In FIG. 10, an NPN transistor Q1 has a collector connected to a power supply Vc and an emitter connected to an output terminal OUT, a PNP transistor Q2 has a collector connected to a reference potential and an emitter connected to the output terminal OUT, and a CMOS logic circuit 101 is connected to respond to an input signal IN to on/off control base current of the NPN transistor Q1. An NMOS logic circuit 102 is connected between the base of PNP transistor Q2 and the reference potential such as the ground potential and responds to the input signal IN to on/off control base current of the PNP transistor Q2. An NMOS logic circuit 103 is connected between the output terminal OUT and the reference potential and when responding to the input signal IN, it cooperates with the PNP transistor Q2 to switch the output terminal OUT to "0".

The operation of the present embodiment will now be described. Initially, it is assumed that the input signal IN switches from a logical "1" level to a logical "0" level. At that time, the NMOS logical circuits 102 and 103 are turned off and the PNP transistor Q2 is also turned off. On the other hand, the CMOS logical circuit 101 is raised to a "1" level to pass a base current to the NPN transistor Q1, turning on the NPN transistor Q1 and switching the output terminal OUT to "1" level.

Subsequently, when the input signal switches from "0" level to "1" level, the output of CMOS logic circuit 101 is switched from a "1" level to a "0" level and the NPN transistor Q1 is also turned off. On the other hand, the NMOS logic circuits 102 and 103 are both turned on, turning on the PNP transistor Q2. As a result, the output terminal OUT switches from "1" level to "0" level.

The present embodiment is featured in that when the output terminal OUT is switched from "1" level to "0" level, the PNP transistor Q2 and the NMOS logic circuit 103 take advantage of their features to share their roles. Consequently, according to the present embodiment, faster and stronger pull-down than that conventionally effected by the PNP transistor Q2 alone can be accomplished.

Figure 11:
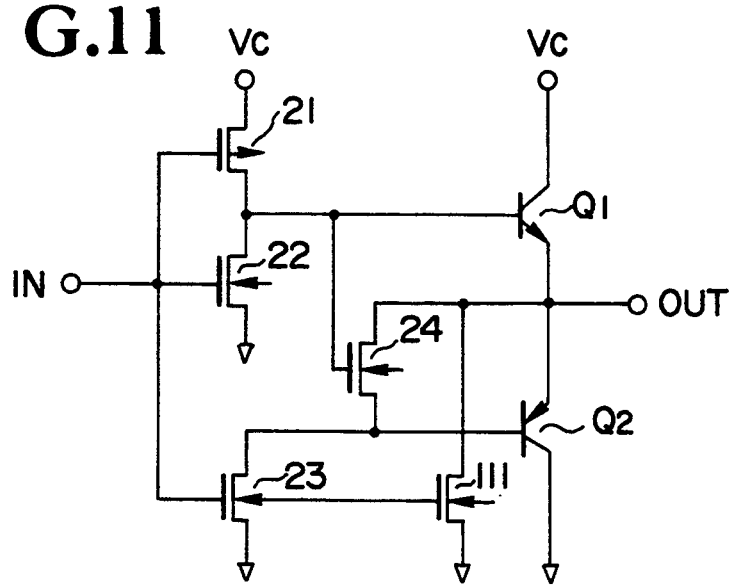
FIG. 11 is a circuit diagram showing a tenth embodiment of the invention.

FIG. 11 shows a tenth embodiment of the invention. In the figure, an NMOS transistor 111 having a drain, a gate and a source respectively connected to an output terminal OUT, an input terminal IN and a reference potential corresponds to the NMOS logic circuit 103 of FIG. 10, and the remaining circuit elements and the function of logic circuits are the same as those of the FIG. 2 embodiment. In the ensuring embodiments inclusive of the present embodiment, pull-down of the output can be achieved at higher speeds by using both of the PNP transistor driven by the NMOS transistor and the NMOS logic circuit and, therefore, only the operation of output pull-down will be explained in the following description.

Initially, it is assumed that an input signal IN (the same reference character is used for the input terminal and input signal) switches from a logical "0" level to a logical "1" level. When the input signal IN exceeds Vth of each of the NMOS transistors 23 and 111, both the NMOS transistors 23 and 111 begin to conduct and pull-down current from the output terminal OUT initially flows through the NMOS transistor 111. On the other hand, in the presence of drain current of the NMOS transistor 23, the base potential of the PNP transistor Q2 begins to decrease but the PNP transistor Q2 will not be turned on before its base potential becomes lower than its emitter potential by $V_{BE}$. Accordingly, passage of pull-down current through the PNP transistor Q2 is delayed relative to the passage of pull-down current through the NMOS transistor 111. From a different viewpoint, it will be appreciated that the passage of pull-down current due to the NMOS transistor 111 precedes passage of pull-down current due to pull-down effected conventionally by the PNP transistor alone and as a result, speed-up of pull-down can be achieved.

In addition, the turn-on speed of the PNP transistor Q2 depends on $f_T$ and available PNP transistors have in general a value of $f_T$ which is about ⅓ or less of a value of $f_T$ possessed by available NPN transistors. As a result, in the conventional circuit, the pull-down speed due to the PNP transistor is extremely low as compared to the pull-up speed due to the NPN transistor and, therefore, the switching performance of the logic circuit is limited by the performance of the PNP transistor.

Figure 28:
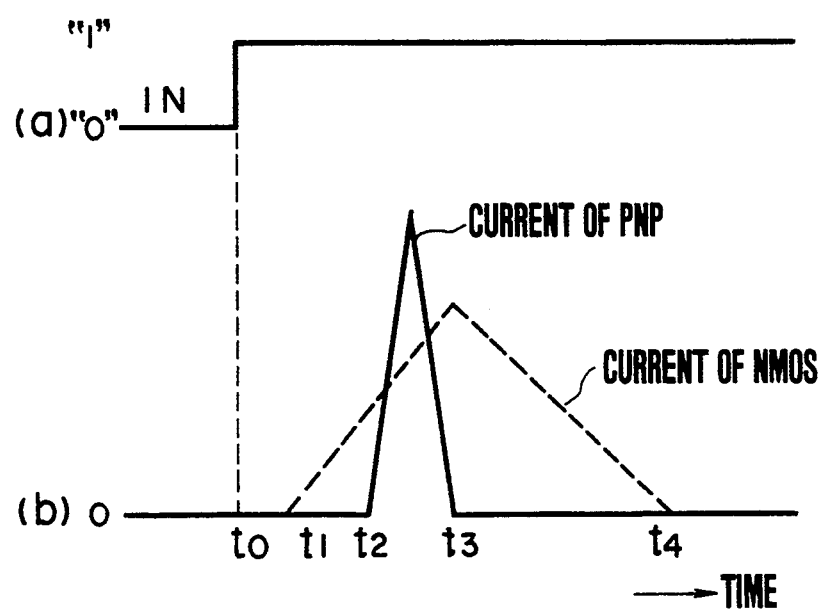
FIG. 28 is a waveform chart showing the operation of the tenth embodiment.

FIG. 28 shows at sections (a) and (b) time responses of pull-down currents through the NMOS transistor and PNP transistor. When the input signal IN switches from a logical "0" level to a logical "1" level at time to as shown by (a) in FIG. 28, a pull-down current due to the NMOS transistor begins to flow at time t1 and the passage of pull-down current continues until time t4. Pull-down current due to the PNP transistor begins to flow at time t2 with a delay relative to the initiation of the pull-down current passage due to the NMOS transistor and continues until time t3. Thus, the pull-down current flows through only the NMOS transistor during a duration of time between times t1 and t2, it flows through both the NMOS and PNP transistors during a duration of time between times t2 and t3 and it again flows through only the NMOS transistor during a duration of time between times t3 and t4. The passage of the pull-down current through the PNP transistor is stopped at time t3 because the level at the output terminal OUT is decreased by the pull-down to decrease emitter-base potential of the PNP transistor to about 0.7 V.

As is clear from FIG. 28, according to the present embodiment, the passage of the pull-down current due to the NMOS transistor preceding the passage of the pull-down current due to the PNP transistor overcomes the limitation on the pull-down performance limited by the performance of the PNP transistor. Further, the passage of the pull-down current due to the PNP transistor is in addition to that of the passage of the pull-down current due to the NMOS transistor, attaining another effect that stronger driving capability than that obtained with the PNP transistor alone can be obtained. A further effect is that by the action of the NMOS transistor, the "0" level of output can be decreased to the reference potential.

Figure 12:
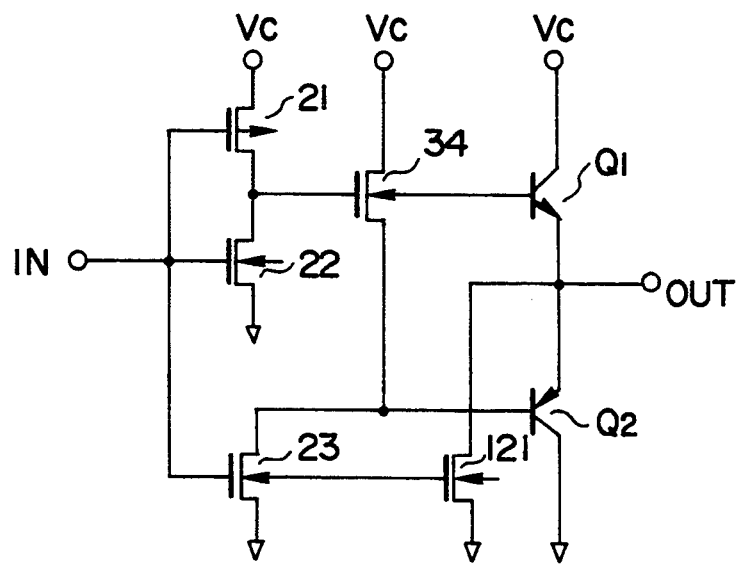
FIG. 12 is a circuit diagram showing an eleventh embodiment of the invention.

FIG. 12 shows an eleventh embodiment of the invention. In FIG. 12, an NMOS transistor 121 has a drain, a gate and a source respectively connected to an output terminal OUT, an input terminal IN and a reference potential, and the remaining circuit elements and the function and feature of logical circuits are the same as those of the FIG. 4 embodiment.

According to the present embodiment, the pull-down of the output OUT is carried out by means of both the NMOS transistor 121 and PNP transistor Q2 as explained in connection with the FIG. 11 embodiment, thereby realizing a logic circuit having faster response and higher driving capability than the conventional logic circuit.

Figure 13:
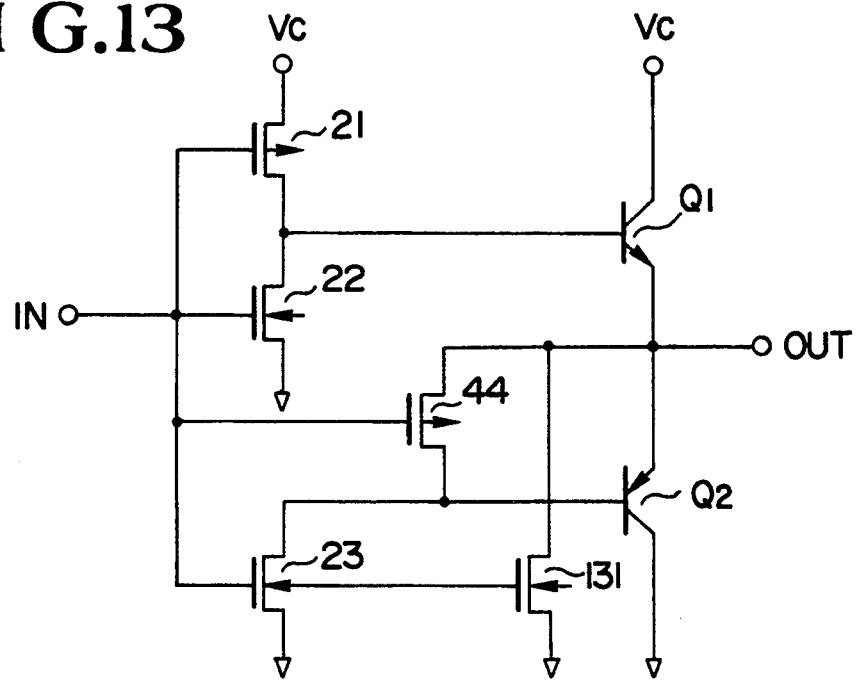
FIG. 13 is a circuit diagram showing a twelfth embodiment of the invention.

FIG. 13 shows a twelfth embodiment of the invention. In FIG. 13, an NMOS transistor 131 has a drain, a gate and a source respectively connected to an output terminal OUT, an input terminal IN and a reference potential, and the remaining circuit elements and the function and feature of logical circuits are the same as those of the FIG. 5 embodiment.

According to the present embodiment, the pull-down of the output OUT is carried out by means of both the NMOS transistor 131 and PNP transistor Q2 as explained in connection with the FIG. 11 embodiment, thereby realizing a logic circuit having faster response and higher driving capability than the conventional logic circuit.

Figure 14:
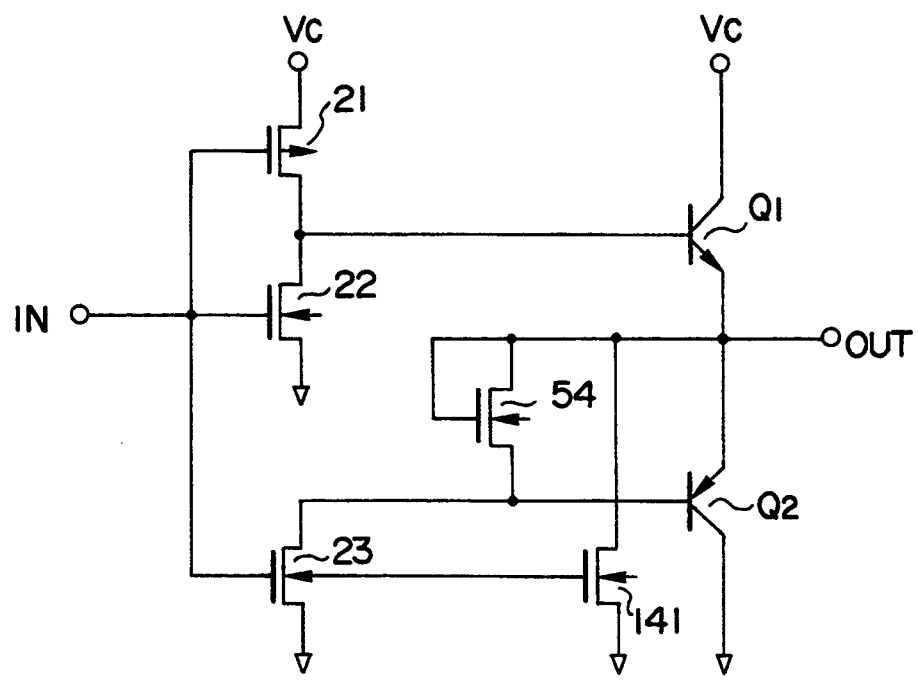
FIG. 14 is a circuit diagram showing a thirteenth embodiment of the invention.

FIG. 14 shows a thirteenth embodiment of the invention. In the figure, an NMOS transistor 141 has a drain, a gate and a source respectively connected to an output terminal OUT, an input terminal IN and a reference potential, and the remaining circuit elements and the function and feature of logical circuits are the same as those of the FIG. 6 embodiment. According to the present embodiment, the pull-down of the output OUT is carried out by means of both the NMOS transistor 141 and PNP transistor Q2 as explained in connection with the FIG. 11 embodiment, thereby realizing a logic circuit having faster response and higher driving capability than the conventional logic circuit.

Figure 15:
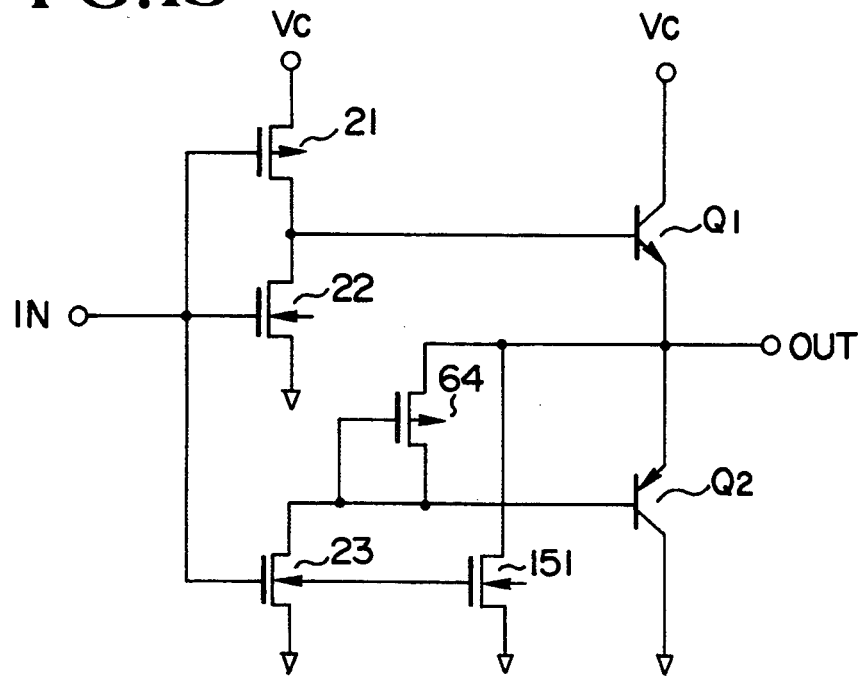
FIG. 15 is a circuit diagram showing a fourteenth embodiment of the invention.

FIG. 15 shows a fourteenth embodiment of the invention. In the figure, an NMOS transistor 151 has a drain, a gate and a source respectively connected to an output terminal OUT, an input terminal IN and a reference potential, and the remaining circuit elements and the function and feature of logic circuits are the same as those of the FIG. 7 embodiment.

According to the present embodiment, the pull-down of the output OUT is carried out by means of both the NMOS transistor 151 and PNP transistor Q2 as explained in connection with the FIG. 11 embodiment, thereby realizing a logic circuit having faster response and higher driving capability than the conventional logical circuit.

Figure 16:
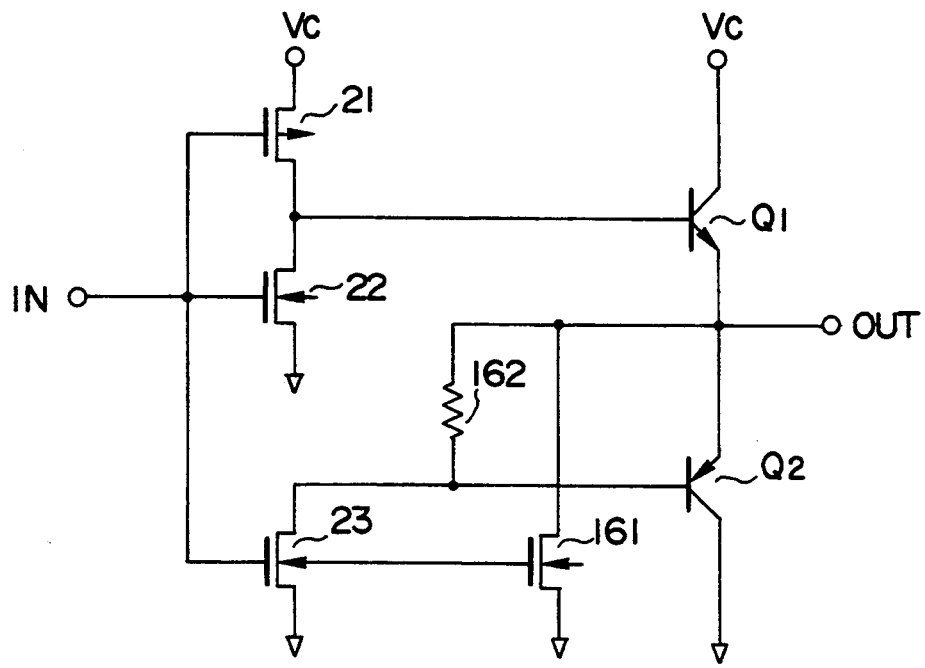
FIG. 16 is a circuit diagram showing a fifteenth embodiment of the invention.

FIG. 16 shows a fifteenth embodiment of the invention. In the figure, an NMOS transistor has a drain connected to an output terminal OUT, a gate connected to an input terminal IN and a source connected to a reference potential, and a resistor 162 connected between the output terminal OUT and a base of a PNP transistor Q2 functions to make the emitter and base of the PNP transistor Q2 equipotential while this transistor remains turned off.

As in the embodiments of FIGS. 11 to 15, the pull-down of the output OUT is also carried out by means of both the NMOS transistor 161 and PNP transistor Q2, thereby realizing a logic circuit having faster response and higher driving capability than the conventional logical circuit.

Figure 17:
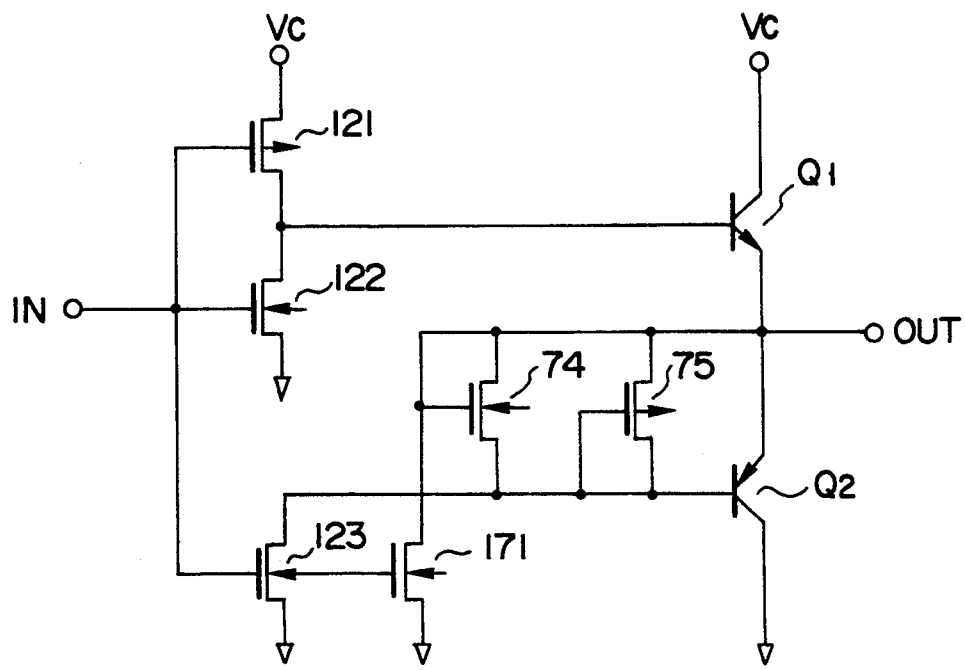
FIG. 17 is a circuit diagram showing a sixteenth embodiment of the invention.

FIG. 17 shows a sixteenth embodiment of the invention. In FIG. 17, an NMOS transistor 171 has a drain, a gate and a source respectively connected to an output terminal OUT, an input terminal IN and a reference potential, and the remaining circuit elements and the function and feature of logic circuit are the same as those of the FIG. 8 embodiment.

According to the present embodiment, the pull-down of the output OUT is carried out by means of both the NMOS transistor 171 and PNP transistor Q2 as explained in connection with the FIG. 11 embodiment, thereby realizing a logic circuit of faster response and higher driving capability.

Figure 18:
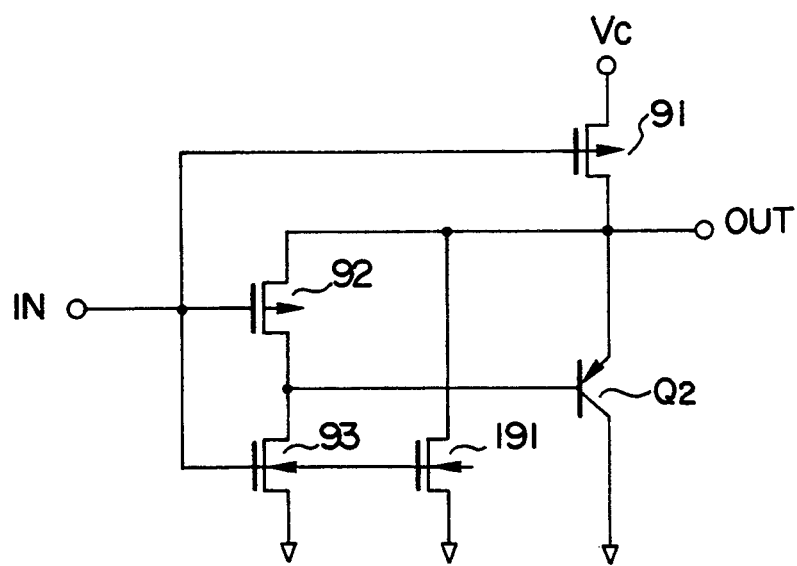
FIG. 18 is a circuit diagram showing a seventeenth embodiment of the invention.

FIG. 18 shows a seventeenth embodiment of the invention. Referring to FIG. 18, an NMOS transistor 191 has a drain, a gate and a source respectively connected to an output terminal OUT, an input terminal IN and a reference potential, and the remaining circuit elements and the function and feature of logic circuit are the same as those of the FIG. 9 embodiment.

According to the present embodiment, the pull-down of the output OUT is carried out by means of both the NMOS transistor 191 and PNP transistor Q2 as explained in connection with the FIG. 11 embodiment, thereby realizing a logic circuit of faster response and higher driving capability.

Figure 19:
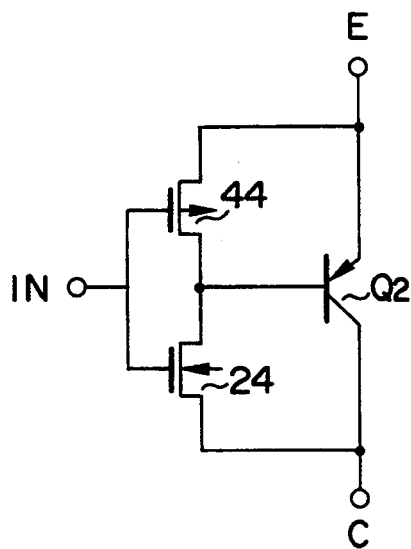
FIG. 19 is a circuit diagram showing an eighteenth embodiment of the invention.

FIG. 19 shows a composite transistor circuit according to an eighteenth embodiment of the invention. This circuit can be formed by extracting the PMOS transistor 44, NMOS transistor 23 and PNP transistor Q2 from FIG. 5 and it operates as will be described below. Assuming now that the input IN switches from a logical "1" level to a logical "0" level, the NMOS transistor 24 is turned off and the PNP transistor Q2 is also turned off. On the other hand, the PMOS transistor 44 is turned on to short-circuit the emitter and base of the PNP transistor Q2. Subsequently, when the input IN switches from a logical "0" level to a logical "1" level, the PMOS transistor 44 is turned off and the NMOS transistor 24 is turned on, thereby turning on the PNP transistor Q2.

Accordingly, the present embodiment may be used as a switch having a high input impedance and a low on-resistance and can afford to be applied as a component of electronic circuit in various applications.

Figure 20:
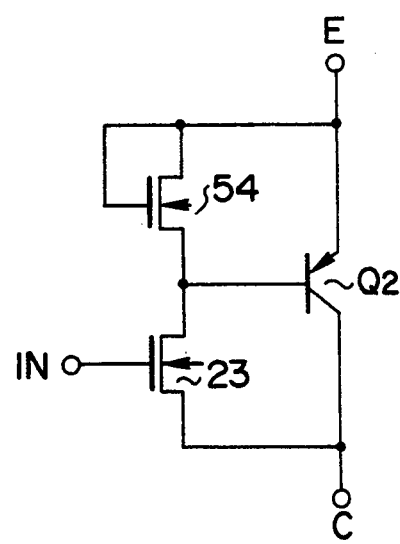
FIG. 20 is a circuit diagram showing a nineteenth embodiment of the invention.

FIG. 20 shows a composite transistor circuit according to a nineteenth embodiment of the invention. This circuit can be formed by extracting the NMOS transistors 54 and 23 and PNP transistor Q2 from FIG. 6 and it operates as follows. Assuming now that the input IN switches from "1" level to "0" level, the NMOS transistor 23 is turned off, turning off the PNP transistor Q2. At that time, through the NMOS transistor 54 which is in diode connection, the base of the PNP transistor Q2 is pre-charged to a potential which is lower than that at its emitter by Vth, thus ensuring steady turning-off of the PNP transistor Q2. Accordingly, the present embodiment may be used as a switch having a high input impedance and a low on-resistance and can afford to be applied as a component of an electronic circuit in various applications.

Figure 21:
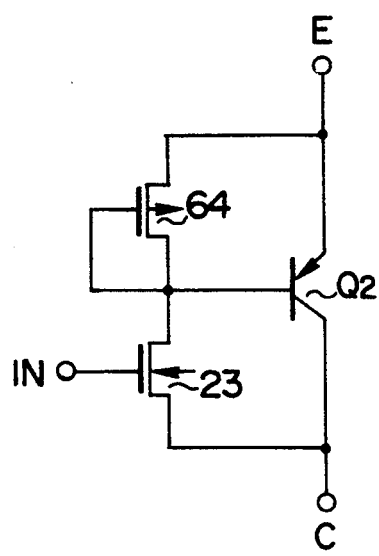
FIG. 21 is a circuit diagram showing a twentieth embodiment of the invention.

FIG. 21 shows a composite transistor circuit according to a twentieth embodiment of the invention. This circuit can be formed by extracting the PMOS transistor 64, NMOS transistor 23 and PNP transistor Q2 from FIG. 7 and it operates as follows. Assuming now that the input IN switches from "1" level to "0" level, the NMOS transistor 23 is turned off, turning off the PNP transistor Q2. At that time, through the PMOS transistor 64 which is in diode connection, the base of the PNP transistor Q2 is pre-charged to a potential which is lower than its emitter potential by Vth, thus ensuring steady turning-off of the PNP transistor Q2. Accordingly, the present embodiment may be used as a switch having a high input impedance and a low on-resistance and can afford to be applied as a component of an electronic circuit in various applications.

Figure 22:
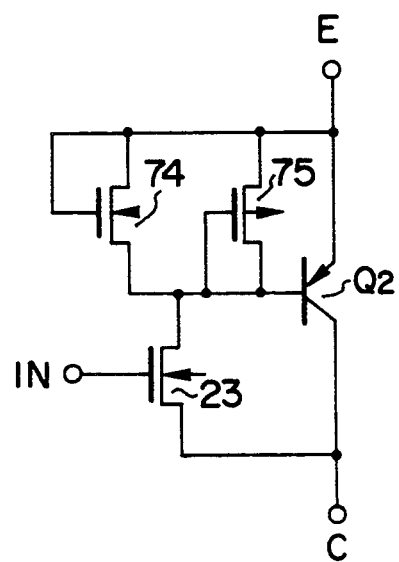
FIG. 22 is a circuit diagram showing a twenty-first embodiment of the invention.

FIG. 22 shows a composite transistor circuit according to a twenty-first embodiment of the invention. This circuit can be formed by extracting the NMOS transistors 74 and 23, PMOS transistor 75 and PNP transistor Q2 from the FIG. 8 embodiment and its operation is as follows. Assuming now that the input IN switches from "1" level to "0" level, the NMOS transistor 23 is turned off, turning off the PNP transistor Q2. At that time, the NMOS transistor 74 and PMOS transistor 75 pre-charge the base of the PNP transistor Q2 to a level which is lower than its emitter level by Vth, thus ensuring steady turning-off of the PNP transistor Q2.

Accordingly, the present embodiment may be used as a switch having a high input impedance and a low on-resistance and can afford to be applied as a component of an electronic circuit in various applications.

Figure 23:
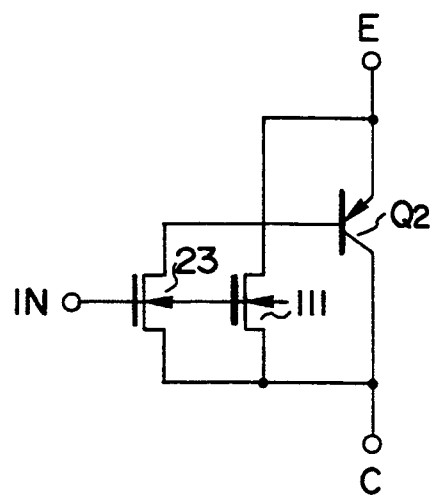
FIG. 23 is a circuit diagram showing a twenty-second embodiment of the invention.

FIG. 23 shows a composite transistor circuit according to a twenty-second embodiment of the invention. This circuit can be formed by extracting the NMOS transistors 23 and 111 and PNP transistor Q2 from the FIG. 11 embodiment and its operation is as follows. Assuming now that the input IN switches from "1" to "0" level, the NMOS transistors 23 and 111 are both turned off, turning off the PNP transistor Q2. On the other hand, when the input IN switches from "0" to "1" level, the NMOS transistors 23 and 111 are both turned on, turning on the PNP transistor Q2.

Accordingly, the present embodiment may be used as a switch having a high input impedance and a low on-resistance and can afford to be applied as a component of an electronic circuit in various applications.

Figure 24:
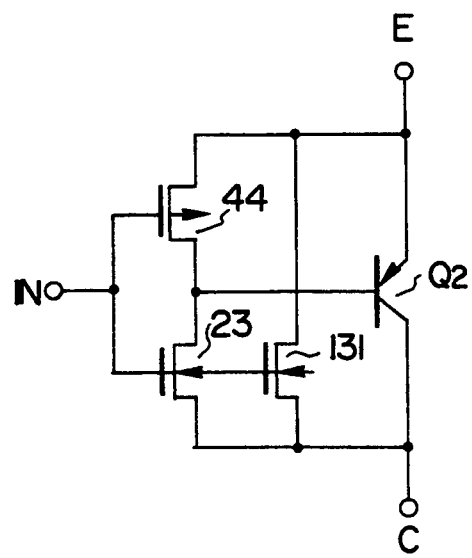
FIG. 24 is a circuit diagram showing a twenty-third embodiment of the invention.

FIG. 24 shows a composite transistor circuit according to a twenty-third embodiment of the invention. This circuit can be formed by extracting the PMOS transistor 44, NMOS transistors 23 and 131 and PNP transistor Q2 from the FIG. 13 embodiment and its operation is as follows. Assuming now that the input IN switches from "1" to "0" level, the NMOS transistors 23 and 131 are turned off, turning off the PNP transistor Q2. At that time, the PMOS transistor 44 is turned on to short-circuit the base and emitter of the PNP transistor Q2, thereby ensuring steady turning-off of the PNP transistor Q2. On the other hand, when the input IN switches from "0" to "1" level, the PMOS transistor 44 is turned off and the NMOS transistors 23 and 111 are turned on, thereby turning on the PNP transistor Q2.

Accordingly, the present embodiment may be used as a switch having a high input impedance and a low on-resistance and can afford to be applied as a component of an electronic circuit in various applications.

Figure 25:
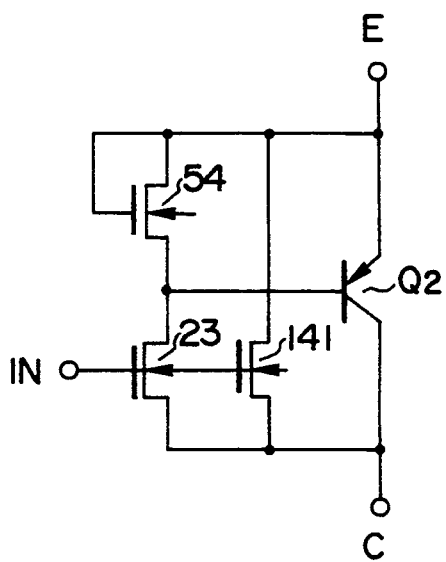
FIG. 25 is a circuit diagram showing a twenty-fourth embodiment of the invention.

FIG. 25 shows a composite transistor circuit according to a twenty-fourth embodiment of the invention. This circuit can be formed by extracting the NMOS transistors 54, 23 and 141 and PNP transistor Q2 from the FIG. 14 embodiment and its operation is as follows. Initially, assuming that the input IN switches from "1" to "0" level, the NMOS transistors 23 and 141 are turned off, turning off the PNP transistor Q2. At that time, through the NMOS transistor 54 being in diode connection, the base of the PNP transistor Q2 is pre-charged to a level which is lower than its emitter level by Vth, thereby ensuring steady turning-off of the PNP transistor Q2. Subsequently, when the input IN switches from "1" to "0" level, the NMOS trnasistors 23 and 141 are both turned on, turning on the PNP transistor Q2.

Accordingly, the present embodiment may be used as a switch having a high input impedance and a low on-resistance and can afford to be applied as a component of an electronic circuit in various applications.

Figure 26:
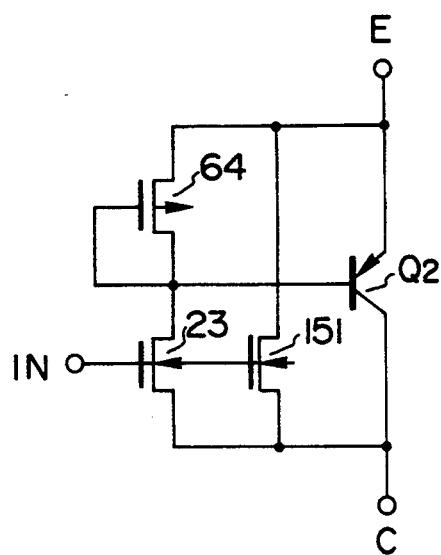
FIG. 26 is a circuit diagram showing a twenty-fifth embodiment of the invention.

FIG. 26 shows a composite transistor circuit according to a twenty-fifth embodiment of the invention. This circuit can be formed by extracting the PMOS transistor 64, NMOS transistors 23 and 151 and PNP transistor Q2 from the FIG. 15 embodiment and its operation is as follows. Assuming now that the input IN switches from "1" to "0" level, the NMOS transistors 23 and 151 are both turned off, turning off the PNP transistor Q2. At that time, through the PMOS transistor 64 being in diode connection, the base of the PNP transistor Q2 is pre-charged to a level which is lower than its emitter level by Vth, thereby ensuring steady turning-off of the PNP transistor Q2. On the other hand, when the input IN switches from "1" to "0" level, the NMOS transistors 23 and 151 are both turned on, turning on the PNP transistor Q2.

Accordingly, the present embodiment may be used as a switch having a high input impedance and a low on-resistance and can afford to be applied as a component of an electronic circuit in various applications.

Figure 27:
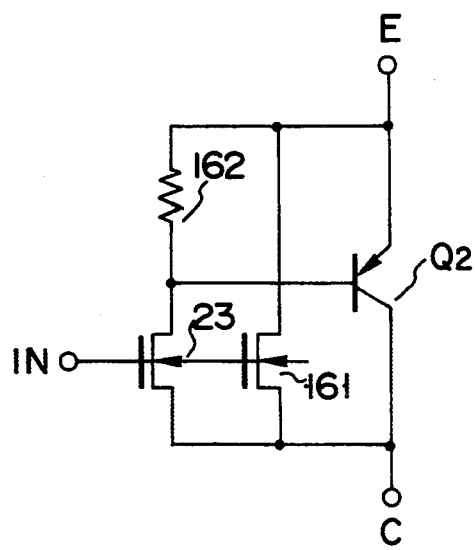
FIG. 27 is a circuit diagram showing a twenty-sixth embodiment of the invention.

FIG. 27 shows a composite transistor circuit according to a twenty-sixth embodiment of the invention. This circuit can be formed by extracting the resistor 162, NMOS transistors 23 and 161 and PNP transistor Q2 from the FIG. 16 embodiment and operates as follows. Firstly, assuming that the input IN switches from "1" to "0" level, the NMOS transistors 23 and 161 are both turned off, turning off the PNP transistor Q2. At that time, through the resistor 162, the base of the PNP transistor Q2 is pre-charged to the same potential as its emitter potential, thereby ensuring steady turning-off of the PNP transistor Q2.

Subsequently, when the input IN switches from "1" to "0", the NMOS transistors 23 and 161 are both turned on, turning on the PNP transistor Q2.

Accordingly, the present embodiment may be used as a switch having a high input impedance and a low on-resistance and can afford to be applied as a component of an electronic circuit in various applications.

Figure 29:
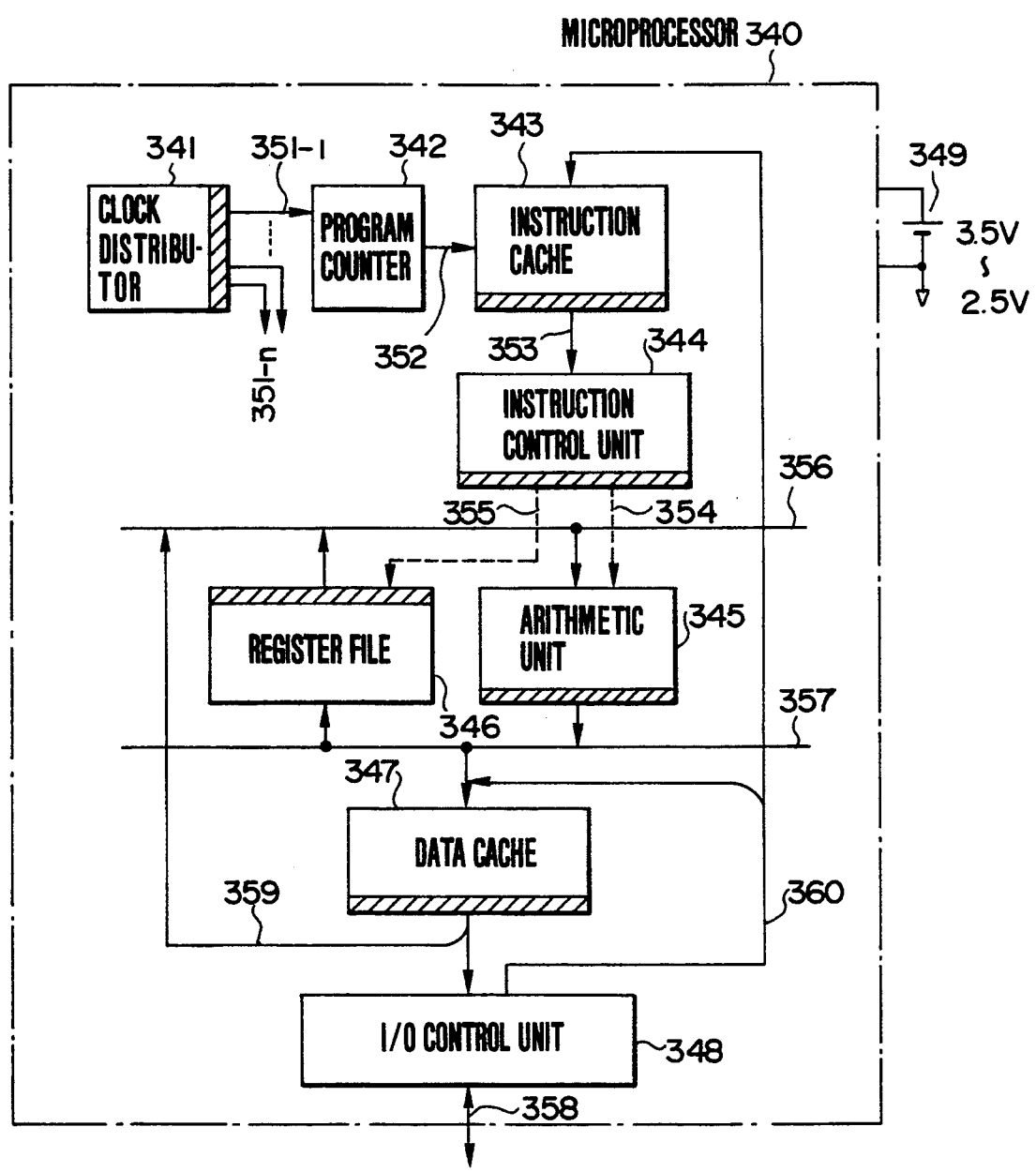
FIG. 29 is a circuit diagram showing a twenty-seventh embodiment of the invention.

FIG. 29 shows an example where a composite circuit of bipolar transistors and MOS transistors according to the invention is applied to the essential part of a microprocessor.

Referring to FIG. 29, the microprocessor as designated by reference numeral 340 is formed on a single or a plurality of semiconductor chips.

A clock distributor 341 distributes a reference clock CLK from its outputs $351_{-1}$ to $351_{-n}$ to a plurality of functional circuit blocks through a driver as hatched in the drawing.

A program counter 342 delivers addresses 352 for reading instructions. An instruction cache 343 reads out an instruction at an address designated by an output signal 352 of the program counter and delivers a readout instruction 353 through a hatched output driver.

An instruction control unit 344 decodes the instruction data to deliver through a hatched driver a signal 354 for controlling an arithmetic, or logical unit 345, a signal 355 for controlling the operation of a register file 346 and other control signals.

The arithmetic unit 345 receives an operation data from a bus 356 to execute an addition/substraction operation, a shift operation and the like and delivers a result to a bus 357 through a hatched driver.

The register file 346 receives data representative of the operation result from the bus 357 to store the same and if desired delivers the data to the bus 356 through a hatched driver.

A data cache 347 stores input data for operation and output data representative of operation results.

Data read out of the data cache 347 is coupled to the bus 356 through a hatched driver and a bus 359 to provide input data to the arithmetic unit 345.

An input/output control unit 348 executes read/-transfer of the output data of the data cache to an external bus 358 and writing data from the external bus into the instruction cache 343 and data cache 347 through a bus 360.

The output driver of each functional block as indicated by hatching is adapted to drive a high or heavy load of approximately 2 to 3 pF to about 10 pF at high speed and may be realized with either the circuits shown in FIGS. 1 to 8 in which the pull-up of the output is carried out by the NPN transistor and the pull-down of the output is effected by the PNP transistor or the circuits shown in FIGS. 10 to 17 wherein the pull-up of the output is carried out by the NPN transistor and the pull-down of the output is effected by both the PNP and NMOS transistors.

Denoted by 349 is a power supply adapted to supply power to the microprocessor 340 and which uses a power supply voltage of around 3.5V to 2.5V in order to maintain the high-speed operation of the hatched driver.

Through this, each of the pull-up and pull-down of heavy load signals which is one obstacles encountered in improving the operation speed can now, however, be effected at a high speed to attain the effect of greatly reducing the machine cycle of the microprocessor.

Since the microprocessor of the present invention can be operated with a low-voltage power supply of around 3.5V to 2.5V, the power consumption which is another obstacle that would otherwise be encountered in realizing new-generation microprocessors of ultra high speed and ultra high integration can now advantageously be reduced to a great extent.

In addition to the application to the microprocessor, the composite circuit of bipolar transistors and MOS transistors according to the invention can be applied widely to various semiconductor integrated circuit devices (for example, memories) and systems.

As is clear from the foregoing description, the complementary emitter follower type BiCMOS logical circuit according to the invention has the construction wherein the NPN transistor for pull-up and the PNP transistor for pull-down are driven independently of each other by the CMOS and NMOS logic circuits and the base potential of the PNP transistor is pre-charged to a proper level, and therefore it can respond to a change in the input signal at a high speed to provide a high-speed switching characteristic to advantage. Further, according to another structural aspect of the present invention, the NMOS logical circuit for pull-down is operated in advance of the operation of the PNP transistor for pull-down, and therefore the high-speed switching performance can advantageously be obtained which is superior to the switching performance of the PNP transistor alone.

In addition, the composite transistor circuit of bipolar transistors and MOS transistors disclosed in the present invention is expected to be applied widely as a switch circuit which features a high input impedance and a low on-resistance.

We claim:

1. A composite circuit of bipolar transistors and MOS transistors comprising:
   an output stage comprised of an NPN transistor and a PNP transistor each having an emitter, base and collector, said NPN transistor and said PNP transistor being connected in series between a power supply terminal and a reference potential terminal;
   a CMOS logic circuit responsive to an input signal and adapted to effect on-off control of said NPN transistor;
   an NMOS logic circuit responsive to said input signal and adapted to effect on-off control of said PNP transistor;
   means adapted for pre-charging a base node of said PNP transistor to a predetermined level while said PNP transistor is turned off; and
   means for providing an output signal from a common junction between said NPN and PNP transistors,
   wherein the base of each of said NPN and PNP transistors is electrically isolated from the base of the other during the on-off control of said NPN and PNP transistors.

2. A composite circuit of bipolar transistors and MOS transistors comprising:
   an NPN transistor having a base, a collector connected to a power supply terminal and an emitter connected to an output terminal;
   a PNP transistor having a base, a collector connected to a reference potential terminal and an emitter connected to said output terminal;
   a CMOS logic circuit responsive to an input signal and adapted to effect on-off control of said NPN transistor;
   an NMOS logic circuit connected between a base of said PNP transistor and said reference potential terminal and responsive to said input signal to effect on-off control of said PNP transistor; and
   pre-charge means connected to the base of said PNP transistor to pre-charge a base node of said PNP transistor to a predetermined level while said PNP transistor is turned off,
   wherein the base of each of said NPN and PNP transistors is electrically isolated from the base of the other during the on-off control of said NPN and PNP transistors.

3. A composite circuit of bipolar transistors and MOS transistors comprising:
   an NPN transistor having a collector connected to a power supply terminal and an emitter connected to an output terminal;
   a PNP transistor having a collector connected to a reference potential terminal and an emitter connected to said output terminal;
   a CMOS logic circuit having an output connected to the base of said NPN transistor and responsive to an input signal to effect on-off control of said NPN transistor;
   an NMOS logic circuit connected between the base of said PNP transistor and said reference potential terminal and responsive to the input signal to effect on-off control of said PNP transistor; and
   an NMOS transistor having a drain connected to said output terminal, a gate connected to the base of said NPN transistor and a source connected to the base of said PNP transistor,
   wherein the base of each of said NPN and PNP transistors is electrically isolated from the base of the other during the on-off control of said NPN and PNP transistors.

4. A composite circuit of bipolar transistors and MOS transistors comprising:
   an NPN transistor having a collector connected to a power supply terminal and an emitter connected to an output terminal;
   a PNP transistor having a collector connected to a reference potential terminal and an emitter connected to said output terminal;
   a CMOS logic circuit having an output connected to a base of said NPN transistor and responsive to an input signal to effect on-off control of said NPN transistor;
   an NMOS logic circuit connected between a base of said PNP transistor and said reference potential terminal and responsive to the input signal to effect on-off control of said PNP transistor; and
   an NMOS transistor having a drain connected to said power supply terminal, a gate connected to the base of said NPN transistor and a source connected to the base of said PNP transistor,
   wherein the base of each of said NPN and PNP transistors is electrically isolated from the base of the other during the on-off control of said NPN and PNP transistors.

5. A composite circuit of bipolar transistors and MOS transistors comprising:
   an NPN transistor having a collector connected to a power supply terminal and an emitter connected to an output terminal;
   a PNP transistor having a collector connected to a reference potential terminal and an emitter connected to said output terminal;
   a CMOS logic circuit having an output connected to a base of said NPN transistor and responsive to an input signal to effect on-off control of said NPN transistor;
   an NMOS logic circuit connected between a base of said PNP transistor and said reference potential terminal and responsive to the input signal to effect on-off control of said PNP transistor; and
   a PMOS transistor having a source connected to said output terminal, a gate connected to receive the input signal and a drain connected to the base of said PNP transistor,
   wherein the base of each of said NPN and PNP transistors is electrically isolated from the base of the other during the on-off control of said NPN and PNP transistors.

6. A composite circuit of bipolar transistors and MOS transistors comprising:
   an NPN transistor having a collector connected to a power supply terminal and an emitter connected to an output terminal;
   a PNP transistor having a collector connected to a reference potential terminal and an emitter connected to said output terminal;
   a CMOS logic circuit having an output connected to a base of said NPN transistor and responsive to an input signal to effect on-off control of said NPN transistor;
   an NMOS logic circuit connected between a base of said PNP transistor and said reference potential terminal and responsive to the input signal to effect on-off control of said PNP transistor; and
   an NMOS transistor having a drain and a gate connected in common to said output terminal and a source connected to the base of said PNP transistor, wherein the base of each of said NPN and PNP transistors is electrically isolated from the base of the other during the on-off control of said NPN and PNP transistors.

7. A composite circuit of bipolar transistors and MOS transistors comprising:

an NPN transistor having a collector connected to a power supply terminal and an emitter connected to an output terminal;

a PNP transistor having a collector connected to a reference potential terminal and an emitter connected to said output terminal;

a CMOS logic circuit having an output connected to a base of said NPN transistor and responsive to an input signal to effect on-off control of said NPN transistor;

an NMOS logic circuit connected between a base of said PNP transistor and said reference potential terminal and responsive to the input signal to effect on-off control of said PNP transistor; and a PMOS transistor having a source connected to said output terminal, and a gate and a drain connected in common to the base of said PNP transistor, wherein the base of each of said NPN and PNP transistors is electrically isolated from the base of the other during the on-off control of said NPN and PNP transistors.

8. A composite circuit of bipolar transistors and MOS transistors comprising:

an NPN transistor having a collector connected to a power supply terminal and an emitter connected to an output terminal;

a PNP transistor having a collector connected to a reference potential terminal and an emitter connected to said output terminal;

a CMOS logic circuit having an output connected to a base of said NPN transistor and responsive to an input signal to effect on-off control of said NPN transistor;

an NMOS logic circuit connected between a base of said PNP transistor and said reference potential terminal and responsive to the input signal to effect on-off control of said PNP transistor;

an NMOS transistor having a drain and a gate connected in common to said output terminal and a source connected to the base of said PNP transistor, and a PMOS transistor having a source connected to said output terminal, and a gate and a drain connected in common to the base of said PNP transistor, wherein the base of each of said NPN and PNP transistors is electrically isolated from the base of the other during the on-off control of said NPN and PNP transistors.

9. A composite circuit of bipolar transistors and MOS transistors comprising:

a first PMOS logic circuit comprising a first PMOS transistor having a source connected to a power supply terminal, a gate connected to an input terminal and a drain connected to an output terminal;

a PNP transistor having a collector connected to a reference potential terminal and an emitter connected to said output terminal;

an NMOS logic circuit connected between a base of said PNP transistor and said reference potential terminal and responsive to an input signal to effect on-off control of said PNP transistor; and a second PMOS logic circuit comprising a second PMOS transistor having a source connected to said output terminal, a gate connected to said input terminal and a drain connected to the base of said PNP transistor.

10. A composite circuit of bipolar transistors and MOS transistors comprising:

an NPN transistor having a collector connected to a power supply terminal and an emitter connected to an output terminal;

a PNP transistor having a collector connected to a reference potential terminal and an emitter connected to said output terminal;

a CMOS logic circuit connected between said power supply terminal and said reference potential terminal, having an output connected to a base of said NPN transistor and responsive to an input signal to effect on-off control of said NPN transistor;

a first NMOS logic circuit connected between a base of said PNP transistor and said reference potential terminal and responsive to the input signal to effect on-off control of said PNP transistor; and a second NMOS logic circuit connected between said output terminal and said reference potential terminal and responsive to the input signal so as to be turned on and off, wherein the base of each of said NPN and PNP transistors is electrically isolated from the base of the other during the on-off control of said NPN and PNP transistors.

11. A composite circuit of bipolar transistors and MOS transistors comprising:

an output stage comprised of an NPN transistor and a PNP transistor each having a base, emitter and collector, which are connected between a power supply terminal and a reference potential terminal and an NMOS transistor connected in parallel with the emitter and collector of said PNP transistor;

a CMOS logic circuit responsive to an input signal and adapted to effect on-off control of said NPN transistor;

an NMOS logic circuit responsive to the input signal and adapted to effect on-off control of said PNP transistor;

means adapted for pre-charging a base node of said PNP transistor to a predetermined level while said PNP transistor is turned off; and means for providing an output signal from a common junction of said NPN, PNP and NMOS transistors, wherein said CMOS logic circuit and said NMOS logic circuit have outputs coupled to the base of said NPN transistor and said PNP transistor, respectively, and wherein the base of each of said NPN and PNP transistors is electrically isolated from the base of the other during the on-off control of said NPN and PNP transistors.

12. A composite circuit of bipolar transistors and MOS transistors according to claim 3, further comprising another NMOS logic circuit including an NMOS transistor having a drain connected to said output terminal, a gate connected to receive the input signal and a source connected to said reference potential terminal.

13. A composite circuit of bipolar transistors and MOS transistors according to claim 4, further comprising another NMOS logic circuit including an NMOS transistor having a drain connected to said output terminal, a gate connected to receive the input signal and a source connected to said reference potential terminal.

14. A composite circuit of bipolar transistors and MOS transistors according to claim 5, further comprising another NMOS logic circuit including an NMOS transistor having a drain connected to said output terminal, a gate connected to receive the input signal and a source connected to said reference potential terminal.

15. A composite circuit of bipolar transistors and MOS transistors according to claim 6, further comprising another NMOS logic circuit including an NMOS transistor having a drain connected to said output terminal, a gate connected to receive the input signal and a source connected to said reference potential terminal.

16. A composite circuit of bipolar transistors and MOS transistors according to claim 7, further comprising another NMOS logic circuit including an NMOS transistor having a drain connected to said output terminal, a gate connected to receive the input signal and a source connected to said reference potential terminal.

17. A composite circuit of bipolar transistors and MOS transistors comprising:
   an NPN transistor having a collector connected to a power supply terminal and an emitter connected to an output terminal;
   a PNP transistor having a collector connected to a reference potential terminal and an emitter connected to said output terminal;
   a CMOS logic circuit having an output connected to a base of said NPN transistor and responsive to an input signal to effect on-off control of said NPN transistor;
   an NMOS logic circuit connected between a base of said PNP transistor and said reference potential terminal and responsive to the input signal to effect on-off control of said PNP transistor;
   a resistor connected between said output terminal and the base of said PNP transistor; and
   an NMOS logic circuit comprising an NMOS transistor having a drain connected to said output terminal, a gate connected to receive the input signal and a source connected to said reference potential terminal.

18. A composite circuit of bipolar transistors and MOS transistors according to claim 8, further comprising another NMOS logic circuit including an MOS transistor having a drain connected to said output terminal, a gate connected to receive the input signal and a source connected to said reference potential terminal.

19. A composite circuit of bipolar transistors and MOS transistors according to claim 9, further comprising another NMOS logic circuit including an NMOS transistor having a drain connected to said output terminal, a gate connected to receive the input signal and a source connected to said reference potential terminal.

20. A composite circuit of bipolar transistors and MOS transistors for providing a switch having a high input impedance and low on-resistance, comprising:
   a PNP transistor provided with on-off operation states having a collector, a base and an emitter;
   a PMOS transistor including a source connected to the emitter of said PNP transistor, a gate connected to an input terminal and a drain connected to the base of said PNP transistor; and
   an NMOS transistor having a drain connected to the base of said PNP transistor, a gate connected to said input terminal and a source connected to the collector of said PNP transistor,
   wherein in an off operation state of said PNP transistor, said PMOS transistor operates as a pre-charge path to the base of said PNP transistor and prevents turn-on of said PNP transistor.

21. A composite circuit of bipolar transistors and MOS transistors for providing a switch having a high input impedance and low on-resistance, comprising:
   a PNP transistor provided with on-off operation states having a collector, a base and an emitter;
   a first NMOS transistor having a drain and a gate connected in common to the emitter of said PNP transistor and a source connected to the base of said PNP transistor; and
   a second NMOS transistor having a drain connected to the base of said PNP transistor, a gate connected to an input terminal and a source connected to the collector of said PNP transistor,
   wherein in an off operation state of said PNP transistor, said first NMOS transistor operates as a pre-charge path to the base of said PNP transistor and prevents turn-on of said PNP transistor.

22. A composite circuit of bipolar transistors and MOS transistors for providing a switch having a high input impedance and low on-resistance, comprising:
   a PNP transistor provided with on-off operation states having a collector, a base and an emitter;
   a PMOS transistor having a source connected to the emitter of said PNP transistor and a gate and a drain connected in common to the base of said PNP transistor; and
   an NMOS transistor having a drain connected to the base of said PNP transistor, a gate connected to an input terminal and a source connected to the collector of said PNP transistor,
   wherein in an off operation state of said PNP transistor, said PMOS transistor operates as a pre-charge path to the base of said PNP transistor and prevents turn-on of said PNP transistor.

23. A composite circuit of bipolar transistors and MOS transistors for providing a switch having a high input impedance and low on-resistance, comprising:
   a PNP transistor provided with on-off operation states having a collector, a base and an emitter;
   a first NMOS transistor having a drain and a gate connected in common to the emitter of said PNP transistor and a source connected to the base of said PNP transistor;
   a PMOS transistor having a source connected to the emitter of said PNP transistor, a gate and a drain connected in common to the base of said PNP transistor; and
   a second NMOS transistor having a drain connected to the base of said PNP transistor, a gate connected to an input terminal and a source connected to the collector of said PNP transistor,
   wherein in an off operation state of said PNP transistor, said first NMOS transistor and said PMOS transistor operates as a pre-charge path to the base of said PNP transistor and prevents turn-on of said PNP transistor.

24. A composite circuit of bipolar transistors and MOS transistors for providing a dual-path switch having a high input impedance and low on-resistance, comprising:
   a PNP transistor having a collector, a base and an emitter;

a first NMOS transistor having a drain connected to the base of said PNP transistor, a gate connected to an input terminal and a source connected to the collector of said PNP transistor; and a second NMOS transistor having a drain connected to the emitter of said PNP transistor, a gate connected to said input terminal and a source connected to the collector of said PNP transistor.

25. A composite circuit of bipolar transistors and MOS transistors for providing a dual-path switch having a high input impedance and low on-resistance, comprising:

a PNP transistor having a collector, a base and an emitter;

a PMOS transistor having a source connected to the emitter of said PNP transistor, a gate connected to an input terminal and a drain connected to the base of said PNP transistor;

a first NMOS transistor having a drain connected to the base of said PNP transistor, a gate connected to said input terminal and a source connected to the collector of said PNP transistor; and a second NMOS transistor having a drain connected to the emitter of said PNP transistor, a gate connected to said input terminal and a source connected to the collector of said PNP transistor, wherein in an off operation state of said dual-path switch, said PMOS transistor operates as a pre-charge path to the base of said PNP transistor and prevents turn-on of said PNP transistor.

26. A composite circuit of bipolar transistors and MOS transistors for providing a dual-path switch having a high input impedance and low on-resistance, comprising:

a PNP transistor having a collector, a base and an emitter;

a first NMOS transistor having a drain and a gate connected in common to the emitter of said PNP transistor and a source connected to the base of said PNP transistor;

a second NMOS transistor having a drain connected to the base of said PNP transistor, a gate connected to an input terminal and a source connected to the collector of said PNP transistor; and a third NMOS transistor having a drain connected to the emitter of said PNP transistor, a gate connected to said input terminal and a source connected to the collector of said PNP transistor, wherein in an off operation state of said dual-path switch, said first NMOS transistor operates as a pre-charge path to the base of said PNP transistor and prevents turn-on of said PNP transistor.

27. A composite circuit of bipolar transistors and MOS transistors for providing a dual-path switch having a high input impedance and low on-resistance, comprising:

a PNP transistor having a collector, a base and an emitter;

a PMOS transistor having a source connected to the emitter of said PNP transistor, and a gate and a drain connected in common to the base of said PNP transistor;

a first NMOS transistor having a drain connected to the base of said PNP transistor, a gate connected to an input terminal and a source connected to the collector of said PNP transistor; and a second NMOS transistor having a drain connected to the emitter of said PNP transistor, a gate connected to said input terminal and a source connected to the collector of said PNP transistor, wherein in an off operation state of said dual-switch, said PMOS transistor operates as a pre-charge path to the base of said PNP transistor and prevents turn-on of said PNP transistor.

28. A composite circuit of bipolar transistors and MOS transistors for providing dual-path switch having a high input impedance and low on-resistance, comprising:

PNP transistor having a collector, and base and an emitter;

a resistor connected between the emitter and base of said PNP transistor;

a first NMOS transistor having a drain connected to the base of said PNP transistor, a gate connected to an input terminal and a source connected to the collector of said PNP transistor; and a second NMOS transistor having a drain connected to the emitter of said PNP transistor, a gate connected to said input terminal and a source connected to the collector of said PNP transistor, wherein in an off operation state of said PNP transistor, said resistor operates as a pre-charge path to the base of said PNP transistor and prevents turn-on of said PNP transistor.

29. A semiconductor integrated circuit device comprising:

a P-type semiconductor integrated circuit device comprising:

a P-type semiconductor substrate; and a composite circuit of bipolar transistors and MOS transistors including an NPN transistor having a collector connected to a power supply terminal and an emitter connected to an output terminal, a PNP transistor having an emitter connected to said output terminal and a collector connected to a reference potential terminal, and a plurality of MOS transistors having gates connected to an input terminal and being adapted, in response to an input signal at said input terminal, to provide complementary on-off operation states of said NPN and PNP transistors through control of base currents thereof, wherein the collectors of said NPN and PNP transistors are isolated from said P-type semiconductor substrate, and wherein the base of each of said NPN and PNP transistors is electrically isolated from the base of the other during the on-off control of said NPN and PNP transistors.

30. A microprocessor comprising, as a functional circuit block, at least one of a clock distributor, a program counter, a cache memory, an arithmetic unit, a register file and an input/output control unit, said at least one functional circuit block including a plurality of signal output drivers at least one of which is comprised of a composite circuit in which pull-up of a signal of the driver output is effected by an NPN transistor driven by a first MOS transistor circuit and pull-down of the signal is effected by a PNP transistor driven by a second, different MOS transistor circuit, wherein the base of each of said NPN and PNP transistors is electrically isolated from the base of the other during the on-off control of said NPN and PNP transistors.

31. A microprocessor according to claim 30 which is operated with a power supply taken from a range of about 3.5V to 2.5V to ensure compatibility of high-speed operation and low power consumption.

32. A composite circuit of bipolar transistors and MOS transistors according to claim 9,
wherein during on-off control of the said PNP transistor and of said first PMOS transistor, the composite circuit is adapted to provide electrical isolation between the base of said PNP transistor and the gate of said first PMOS transistor.

33. A composite circuit of bipolar transistors and MOS transistors according to claim 17,
wherein during on-off control of said PNP transistor and of said NPN transistor, the composite circuit is adapted to provide electrical isolation between the base of said PNP transistor and the gate of said NPN transistor.

34. A composite circuit of bipolar transistors and MOS transistors according to claim 20,
wherein said switch is included in a pull-up/pull-down driver circuit having a pull-up output NPN transistor in a totem pole connection with the PNP transistor of said switch, said NPN and PNP transistors are independently driven at their bases, and
wherein the base of each of said NPN and PNP transistors is electrically isolated from the base of the other during the on-off control of said NPN and PNP transistors.

35. A composite circuit of bipolar transistors and MOS transistors according to claim 24,
wherein said dual-path switch is included in a pull-up/pull-down driver circuit having a pull-up output NPN transistor in a totem pole connection with the PNP transistor of said dual-path switch, said NPN and PNP transistors are independently driven at their bases, and
wherein the base of each of said NPN and PNP transistors is electrically isolated from the base of the other during the on-off control of said NPN and PNP transistors.

36. A composite circuit of bipolar transistors and MOS transistors according to claim 1, wherein said CMOS logic circuit and said NMOS logic circuit are comprised of one or more input type inverting logic circuits, respectively.

37. A composite circuit of bipolar transistors and MOS transistors according to claim 11, wherein said CMOS logic circuit and said NMOS logic circuit are comprised of one or more input type inverting logic circuits, respectively.

38. A composite circuit of bipolar transistors and MOS transistors according to claim 1, wherein the voltage applied across the power supply terminal and reference potential terminal is taken from a range including 2.5V to 3.5V.

39. A composite circuit of bipolar transistors and MOS transistors according to claim 9, wherein the voltage applied across the power supply terminal and reference potential terminal is taken from a range including 2.5V to 3.5V.

40. A composite circuit of bipolar transistors and MOS transistors according to claim 10, wherein the voltage applied across the power supply terminal and reference potential terminal is taken from a range including 2.5V to 3.5V.

41. A composite circuit of bipolar transistors and MOS transistors according to claim 11, wherein the voltage applied across the power supply terminal and reference potential terminal is taken from a range including 2.5V to 3.5V.

42. A composite circuit of bipolar transistors and MOS transistors according to claim 29, wherein the voltage applied across the power supply terminal and reference potential terminal is taken from a range including 2.5V to 3.5V.

* * * * *